(12) United States Patent
Weldon et al.

(10) Patent No.: US 12,248,344 B2
(45) Date of Patent: Mar. 11, 2025

(54) TECHNOLOGIES FOR LIQUID COOLING INTERFACES

(71) Applicant: Intel Corporation, Santa Clara, CA (US)

(72) Inventors: Kristin L. Weldon, Hillsboro, OR (US); David Rodriguez, Hillsboro, OR (US); Jin Yang, North Plains, OR (US); David Shia, Portland, OR (US); Jimmy Chuang, New Taipei (TW); Mohanraj Prabhugoud, Beaverton, OR (US); Mark Edmund Sprenger, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 734 days.

(21) Appl. No.: 17/214,230

(22) Filed: Mar. 26, 2021

(65) Prior Publication Data
US 2021/0216121 A1    Jul. 15, 2021

(51) Int. Cl.
*G06F 1/20* (2006.01)
*H05K 7/20* (2006.01)

(52) U.S. Cl.
CPC .......... *G06F 1/203* (2013.01); *H05K 7/20272* (2013.01); *G06F 2200/201* (2013.01)

(58) Field of Classification Search
None
See application file for complete search history.

(56) References Cited

U.S. PATENT DOCUMENTS

| | | | |
|---|---|---|---|
| 7,523,967 B2* | 4/2009 | Steppe | A61M 39/10 604/905 |
| 9,951,998 B2* | 4/2018 | Bardeleben | F28F 9/0258 |
| 10,098,816 B2* | 10/2018 | Carney | A61M 39/1011 |
| 10,791,648 B1* | 9/2020 | Franz | H05K 7/20272 |
| 10,945,353 B2* | 3/2021 | Faneuf | H05K 1/18 |

(Continued)

FOREIGN PATENT DOCUMENTS

| CN | 103049062 A | 4/2013 |
|---|---|---|
| CN | 207663388 U | 7/2018 |

(Continued)

OTHER PUBLICATIONS

CoolIT Systems Technology, available at https://www.coolitsystems.com/technology/, accessed Apr. 26, 2021 (19 pages).

(Continued)

*Primary Examiner* — Xanthia C Relford
(74) *Attorney, Agent, or Firm* — Hanley, Flight & Zimmerman, LLC

(57) ABSTRACT

Techniques for liquid cooling interfaces with rotatable connector assemblies are disclosed. In one embodiment, a collar contacts flanges on two components of a connector assembly, preventing them from separating. In another embodiment, a housing is positioned around a stem component. The stem component has a gap between a top part and a bottom part held apart by pillars, allowing water to flow to a tubing fitting connected to the housing. A retainer on top of the stem component holds the housing in place. In yet another embodiment, an internal retainer holds a housing component in place over a stem. Other embodiments are disclosed.

25 Claims, 18 Drawing Sheets

(56) References Cited

U.S. PATENT DOCUMENTS

| | | |
|---|---|---|
| 2003/0151130 A1 | 8/2003 | Cheon |
| 2005/0046179 A1* | 3/2005 | Lee .................... F16L 19/0231 |
| | | 285/354 |
| 2011/0209785 A1* | 9/2011 | Elton .................... A61M 39/10 |
| | | 138/155 |
| 2012/0106071 A1* | 5/2012 | Eagle ...................... G06F 1/20 |
| | | 361/679.47 |
| 2013/0299139 A1* | 11/2013 | Mounioloux ......... H01L 23/467 |
| | | 165/120 |
| 2015/0167878 A1* | 6/2015 | Liu ..................... F16L 37/0841 |
| | | 285/313 |
| 2016/0138738 A1* | 5/2016 | Crompton ............. F16L 13/143 |
| | | 137/15.01 |
| 2016/0341342 A1* | 11/2016 | Arvelo ............... H05K 7/20772 |
| 2017/0122473 A1* | 5/2017 | Hayes, Jr. ............. F16L 47/041 |
| 2020/0003348 A1* | 1/2020 | Sinsel .................... F16L 41/021 |
| 2020/0260613 A1* | 8/2020 | Winkel ............. H05K 7/20927 |
| 2021/0216121 A1 | 7/2021 | Weldon et al. |
| 2021/0320050 A1 | 10/2021 | Robinson et al. |

FOREIGN PATENT DOCUMENTS

| | | |
|---|---|---|
| GB | 2576032 B | 4/2021 |
| GB | 2576030 B | 12/2021 |
| GB | 2597525 A | 2/2022 |
| GB | 2601357 A | 6/2022 |
| KR | 20070116447 A | 12/2007 |
| KR | 101697325 B1 | 1/2017 |

OTHER PUBLICATIONS

PCT International Search Report and Written Opinion issued in PCT/US2022/016974, dated Jun. 7, 2022; 13 pages.

International Searching Authority, "International Preliminary Report on Patentability," issued in connection with PCT Patent Application No. PCT/US2022/016974, issued on Sep. 12, 2023, 8 pages.

* cited by examiner

TECHNOLOGIES FOR LIQUID COOLING INTERFACES

BACKGROUND

Components such as processors dissipate large amounts of heat, which must be removed to prevent the components from overheating. Air cooling by passing air through fins of a heat sink coupled to the component can provide cooling, but air cooling is limited by the relatively low heat capacity of air. Liquid cooling can take advantage of the large heat capacity of water and other liquids relative to air, which may be orders of magnitude higher. However, liquids are generally transported in closed loops using tubes, which raises issues different from those found in air cooling.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Liquid cooling can move large amounts of heat from components in computing devices such as processors. Advantages in liquid cooling may be particularly applicable in data centers with a large number of sleds. The tubing to carry the liquid must connect to an inlet and outlet of each component and must be routed within a computing device, such as between different components, to a radiator, or to external tubing. Low-profile, rotatable connectors on the water blocks may allow for simpler installation and routing and/or may use less space.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. The term "coupled," "connected," and "associated" may indicate elements electrically, electromagnetically, thermally, and/or physically (e.g., mechanically or chemically) co-operate or interact with each other, and do not exclude the presence of intermediate elements between the coupled, connected, or associated items absent specific contrary language. Terms modified by the word "substantially" include arrangements, orientations, spacings, or positions that vary slightly from the meaning of the unmodified term. For example, surfaces described as being substantially parallel to each other may be off of being parallel with each other by a few degrees.

The description may use the phrases "in an embodiment," "in embodiments," "in some embodiments," and/or "in various embodiments," each of which may refer to one or more of the same or different embodiments. Furthermore, the terms "comprising," "including," "having," and the like, as used with respect to embodiments of the present disclosure, are synonymous.

Reference is now made to the drawings, wherein similar or same numbers may be used to designate same or similar parts in different figures. The use of similar or same numbers in different figures does not mean all figures including similar or same numbers constitute a single or same embodiment. In the following description, for purposes of explanation, numerous specific details are set forth in order to provide a thorough understanding thereof. It may be evident, however, that the novel embodiments can be practiced without these specific details. In other instances, well-known structures and devices are shown in block diagram form to facilitate a description thereof. The intention is to cover all modifications, equivalents, and alternatives within the scope of the claims.

Figure 1:
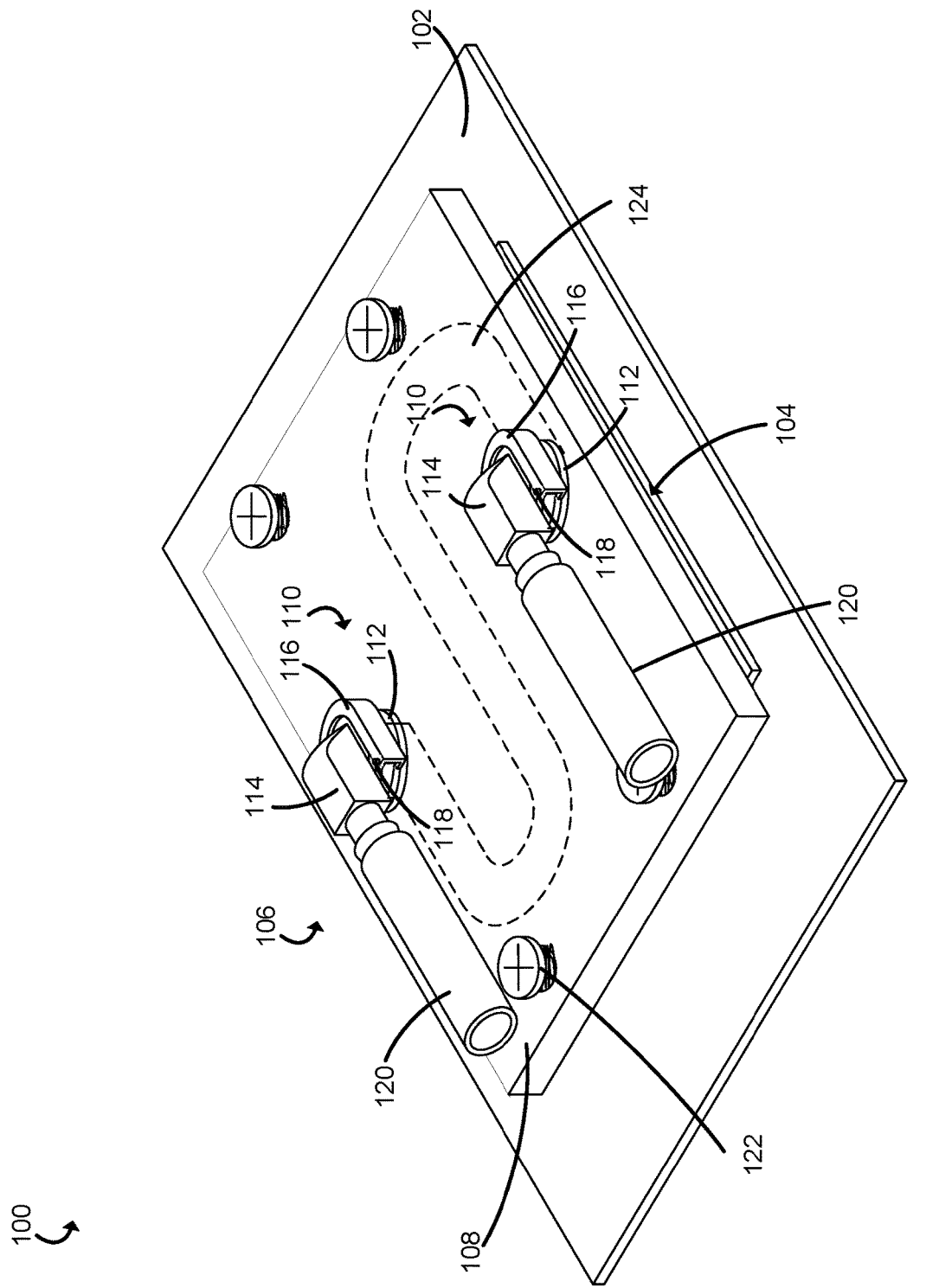
FIG. 1 is a perspective view of a simplified diagram of at least one embodiment of a computing system with a water block with rotatable tubing fittings.

Referring now to FIGS. 1-7, in one embodiment, an illustrative system 100 shown in FIG. 1 includes a system board 102, an integrated circuit component 104 (not visible in FIG. 1), and a water block 106. The illustrative embodiment, the system 100 may be embodied as or otherwise include a computing device. For example, the system 100 may be embodied as or include a desktop computer, a server computer, a blade in a rack of a data center, a sled in a rack of a data center, a manifold of a liquid cooling system, etc.

Figure 2:
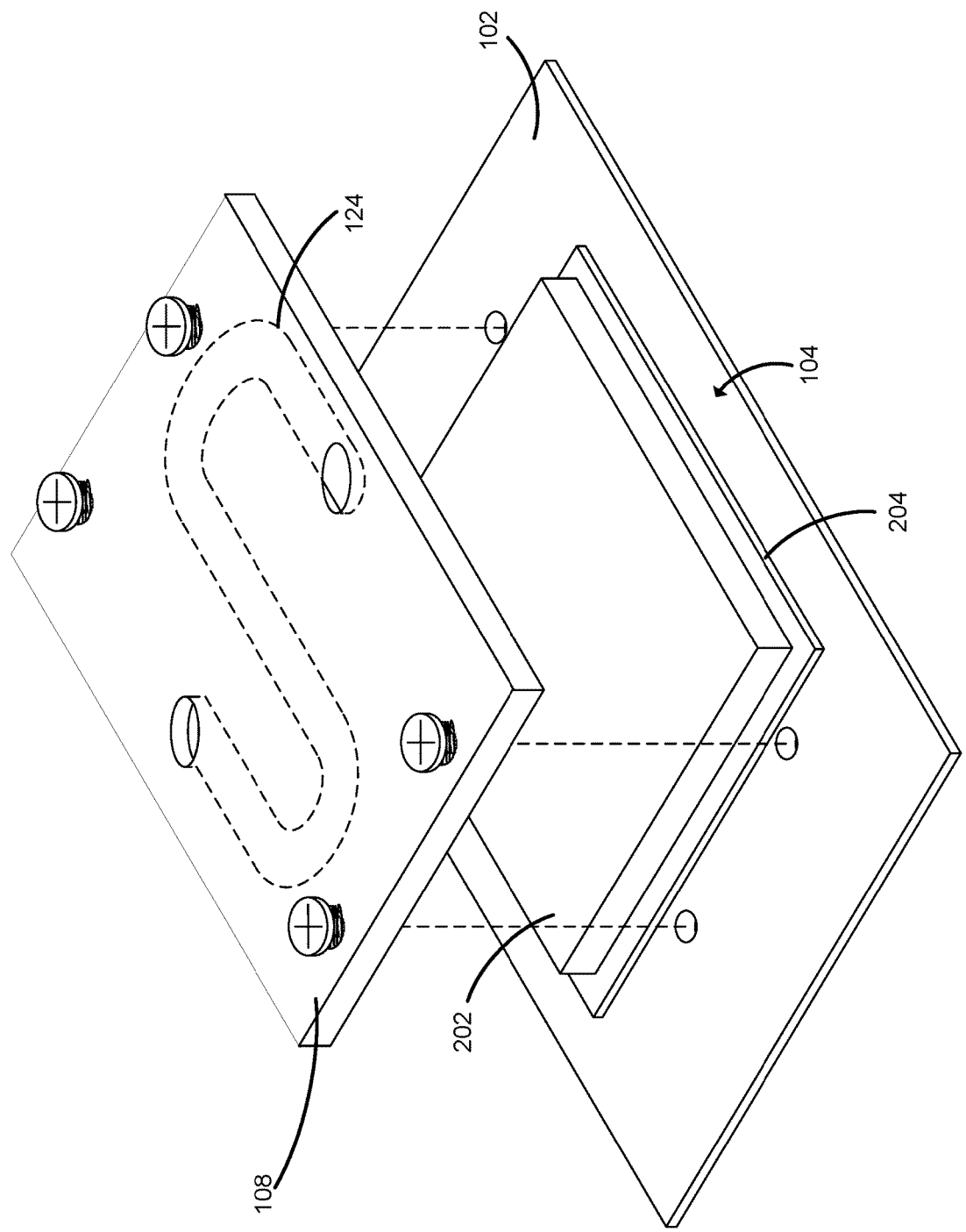
FIG. 2 is a perspective view of a simplified diagram showing the water block of the system of FIG. 1 removed from an integrated circuit component of the system of FIG. 1.

The water block 106 has a base 108 with two rotatable connector assemblies 110, one acting as an inlet and out acting as an outlet. FIG. 2 shows the water block 106 removed from the system board 102 as well as the integrated circuit component 104 and the system board 102. As shown in FIG. 2, the integrated circuit component 104 includes an integrated heat spreader (IHS) 202 mounted on a substrate 204. In use, the base 108 of the water block 106 is thermally coupled to the integrated heat spreader 202, absorbing heat from the integrated circuit component 104. The two connector assemblies 110 are fluidly coupled by an internal channel 124 in the water block 106. As used herein, the phrase "thermally coupled" refers to components that are coupled to facilitate the transfer of heat, and the phrase "fluidly coupled" refers to components that are coupled to facilitate the flow of a fluid between them. A liquid passes through tubing 120 to an inlet connector assembly 110 and then into the internal channel 124 defined in the base 108 of the water block 106. The liquid absorbs heat from the water block, then passes through an outlet connector assembly 110 and into the tubing 120. The liquid is then transported to a radiator, heat exchanger, chiller, or another cooling mechanism to release heat. The liquid then returns to the first connector assembly 110 through the tubing 120.

Figure 3:
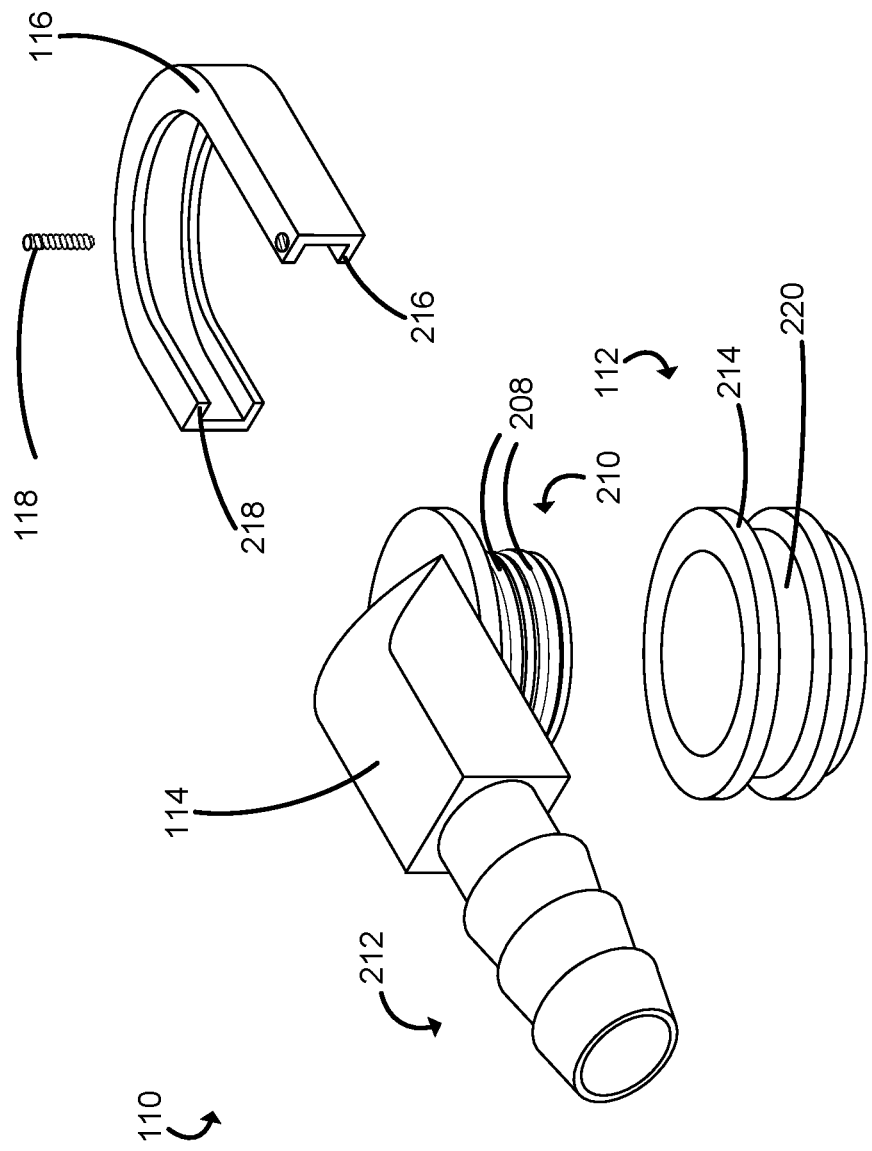
FIG. 3 is a perspective view of a disassembled connector assembly of the system of FIG. 1.

The illustrative rotatable connector assembly 110 is shown disassembled in FIG. 3. The illustrative connector assembly 110 includes a stem component 112, a fitting component 114, and a collar 116. In use, in the illustrative embodiment, the stem component 112 is fixed to the base 108 of the water block 106. The illustrative stem component 112 includes a tube extending from the base 108 toward the fitting component 114, and the tube is fluidly coupled to the internal channel 124 of the base 108. The stem component 112 has a flange 214 extending from the tube. The fitting component 114 includes a neck 210 at one end that extends into the tube 220 of the stem component 112 when the connector assembly 110 is assembled, causing the fitting component 114 to be fluidly coupled to the stem component 112. The fitting component 114 includes a tubing fitting 212 that can mate with tubing 120. One or more O-rings 208 are positioned between the neck 210 of the fitting component 114 and the tube 220 of the stem component 112, providing a seal to keep the liquid inside the components.

The illustrative collar 116 has a collar body that wraps at least partially around the stem component 112 and the fitting component 114. The collar 116 has a first flange 216 that extends from the collar body to engage with the flange 214 of the stem component 112, and a second flange 218 that extends from the collar body to engage with the fitting component 114. A retainer 118 (such as a set screw) is positioned to prevent the collar 116 from being removed. When the collar 116 is in place, the flange 216 and flange 218 will engage with both the flange 214 and the fitting component 114, respectively, preventing the fitting component 114 from being removed from the stem component 112.

In use, the fitting component 114 is rotatable relative to the stem component 112. In the illustrative embodiment, the collar 116 rotates with the fitting component 114, and the stem component 112 has a flange 214 extending 360º around the tube extending from the base 108 without any obstacles to interfere with the rotation of the collar 116. In other embodiments, the collar 116 may maintain the same orientation relative to the stem component 112, engaging a flange on the fitting component 114 that extends 360° around the fitting component 114. In some embodiments, fitting component 114 may be rotatable less than 360°, such as rotatable between 45°-270°. In the illustrative embodiment, the flange 218 engages with a flange on the fitting component 114. In some embodiments, the flange 218 may engage with another surface of the fitting component 114, such as a top surface. In such embodiments, the flange 218 may extend across the entire top opening created by the collar body, forming a top surface of the collar 116. The O-rings 208 may rotate with the fitting component 114 or may stay stationary relative to the stem component 112. It should be appreciated that, in the illustrative embodiment, the O-rings 208 maintain a seal while the fitting component 114 is being rotated.

In the illustrative embodiment, the system board 102 may be embodied as a motherboard. The system board 102 may include other components not shown, such as interconnects, other electrical components such as capacitors or resistors, sockets for components such as memory or peripheral cards, connectors for peripherals, etc. In other embodiments, the system board 102 may form or be a part of another component of a computing device, such as a peripheral card, a graphics card, a mezzanine board, a peripheral board, etc. The illustrative system board 102 is a fiberglass board made of glass fibers and a resin, such as FR-4. In other embodiments, other types of circuit boards may be used. In still other embodiments, such as those in which the connector assembly 110 is in a manifold, a circuit board may not be present.

In the illustrative embodiment, the integrated circuit component 104 is embodied as a processing unit of a computing device. More generally, as used herein, the term "integrated circuit component" refers to a packaged or unpacked integrated circuit product. A packaged integrated circuit component comprises one or more integrated circuits. In one example, a packaged integrated circuit component contains one or more processor units and a land grid array (LGA) or pin grid array (PGA) on an exterior surface of the package. In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system component or type of component described or referenced herein, such as a processor unit (e.g., system-on-a-chip (SoC), processor cores, graphics processor unit (GPU), accelerator), I/O controller, chipset processor, memory, network interface controller, or a three-dimensional integrated circuit (3D IC) face-to-face-based packaging chip such as an Intel® Foveros chip. In one embodiment, the integrated circuit component 104 is a processor unit, such as a single-core processor, a multi-core processor, a desktop processor, a server processor, a data processing unit, a central processing unit, a graphics processing unit, etc. The processor unit may include an integrated memory, such as a high-bandwidth memory. The integrated circuit component 104 may include one or more chips integrated into a multi-chip package (MCP).

The illustrative integrated circuit component 104 includes an IHS 202. The IHS 202 is in thermal contact with the dies of the integrated circuit component 104, either directly or through one or more intermediate layers, such as a thermal interface material (TIM). The illustrative IHS 202 is made out of nickel-plated copper. In other embodiments, the IHS 202 may be made out of or otherwise include any suitable material, such as copper, aluminum, gold, or other high-thermal-conductivity material. In some embodiments, the integrated circuit component 104 may not include an IHS. In such an embodiment, the base 108 of the water block 106 may contact the dies included in the integrated circuit component 104 without an intermediate IHS. It should be appreciated that, in those embodiments, there may still be other layers such as a TIM between the water block 106 and the bare integrated circuit die(s) of the integrated circuit component 104. In such embodiments, the various dies of the integrated circuit component 104 may have different heights, and the water block 106 may have pedestals extending from the base 108 to contact the corresponding dies of the integrated circuit component 104.

The illustrative IHS 202 may be any suitable size. The illustrative IHS 202 has a width of about 30 millimeters, a length of about 60 millimeters, and a height of 5 millimeters. In other embodiments, the IHS 202 may have any suitable dimensions, such as a length and/or width of 50-200 millimeters and a height of 0.5-20 millimeters.

The illustrative substrate 204 includes interconnects to connect electrical paths of the dies of the integrated circuit component 104 both to each other and to external connections, such as to pins of a socket or solder bumps. In some embodiments, the substrate 204 may include embedded multi-die interconnect bridge (EMIB) technology. In the illustrative embodiment, the substrate 204 includes a land grid array of pads. Each pad may be any suitable material, such as gold, copper, silver, gold-plated copper, etc. Additionally or alternatively, in some embodiments, the substrate 204 may include a pin grid array with one or more pins that mate with a corresponding pin socket in a processor socket or a ball grid array. The substrate 204 may include one or more additional components, such as a capacitor, voltage regulator, etc. The illustrative substrate 204 is a fiberglass board made of glass fibers and a resin, such as FR-4. In other embodiments, the substrate 204 may be embodied as any suitable circuit board.

In the illustrative embodiment, the substrate 204 has larger dimensions than the IHS 202 and/or the dies mounted on the substrate 204. The illustrative substrate 204 has a width of about 40 millimeters, a length of about 70 millimeters, and a height of 3 millimeters. In other embodiments, the substrate 204 may have any suitable dimensions, such as a length and/or width of 50-200 millimeters and a height of 0.5-20 millimeters. In some embodiments, the substrate 204 may not extend past the IHS 202. In other embodiments, the integrated circuit component 104 may not include a separate substrate 204. Rather, the dies or other components inside a package may, e.g., contact pins on a processor socket directly.

In the illustrative embodiment, the integrated circuit component 104 may have a thermal interface material (TIM) layer between some or all of the dies and the IHS 202. A TIM layer can be any suitable material, such as a silver thermal compound, thermal grease, phase change materials, indium foils, or graphite sheets. Additionally or alternatively, there may be a TIM layer between the integrated circuit component and the water block 106.

The various dies of the integrated circuit component 104 may generate any suitable amount of heat. For example, in one embodiment, the integrated circuit component 104 may generate up to 500 Watts of power. The power may be split between the various dies in any suitable manner. The integrated circuit component 104 may be maintained at less than any suitable temperature, such as 50-150° C.

The water block 106 may be made from any suitable material. In the illustrative embodiment, the base 108 is made from a high-thermal-conductivity material, such as copper, aluminum, or another material with a thermal conductivity greater than 100 W/(mxK). In some embodiments, the base 108 may have more than one layer of different materials. The illustrative base 108 of the water block 106 is a rectangular shape. In other embodiments, the base 108 may be any suitable shape, such as a square, a circle, etc.

The water block 106 has an internal channel 124 that fluidly couples the two connector assemblies 110. The illustrative channel 124 takes a meandering path through the water block 106 in order to absorb heat from different regions of the water block. In other embodiments, the channel 124 be structured differently, such as by forming a wide channel that passes through a large surface area of the water block 106 simultaneously or by splitting into multiple channels. The internal channel 124 may include one or more fins or other internal or external structure coupled to the fluid in the internal channel 124 to facilitate heat transfer. In some embodiments, the water block 106 may be referred to as a cold plate.

The water block 106 may have any suitable shape or dimensions. For example, the water block 106 may have a width of 10-250 millimeters, a length of 10-250 millimeters, and/or a height of 5-100 millimeters. In the illustrative embodiment, the water block 106 has a width of about 75 millimeters, a length of about 75 millimeters, and a height of about 15 millimeters. The illustrative water block 106 has a square shape. In other embodiments, the water block 106 may be any suitable shape, such as a rectangle, a circle, etc. The illustrative base 108 has a flat surface on the bottom. In some embodiments, the water block 106 may include other heat-transferring components such as a thermoelectric heater/cooler.

The illustrative water block 106 is fastened to the system board 102 by fasteners 122. In the illustrative embodiment, fasteners 122 are embodied as screws or bolts. Fasteners 122 may have a spring that applies a downward force on the base 108 of the water block 106. The fasteners 122 can screw directly into threaded holes of the system board 102 or may be secured by, e.g., a nut. Additionally or alternatively, the fasteners 122 may be embodied as any other suitable type of fastener, such as a torsion fastener, a spring screw, one or more clips, a land grid array (LGA) loading mechanism, and/or a combination of any suitable types of fasteners. In the illustrative embodiment, the fasteners 122 are removable. In other embodiments, some or all of the fasteners 122 may permanently secure the water block 106 to the system board 102. In some embodiments, the system board 102 may include a bolster plate and/or a back plate, and the fasteners 122 may fasten to the bolster plate and/or back plate.

The water block 106 may be manufactured using any suitable technique. In some embodiments, the water block 106 may an internal tube of a different material from the base 108 that defines the internal channel 124, such as a copper or stainless steel tube pressed into a channeled aluminum base 108. In other embodiments, the water block 106 may be created from a top half and a bottom half bonded or otherwise pressed together. More generally, the water block 106 or components thereof may be manufactured in any suitable manner, such as extrusion, skiving, stamping, forging, machining, 3D printing, etc. In some embodiments, one or more pedestals may extend from a bottom surface of the water block 106. Such pedestals may be an integral part of the base 108 or may be a separate component that is fastened or adhered to the base 108.

The tubes 120 connected to each of the connector assemblies 110 may be made from any suitable material, such as flexible polyvinyl chloride (PVC). In the illustrative embodiment, the tubes 120 have an inner diameter of ¼ inches and an outer diameter of ⅜ inches. In other embodiments, the tubes 120 may have any suitable inner diameter, such as ⅛ to 2 inches, and any suitable outer diameter such as 3/16 to 2.5 inches.

Figure 4:
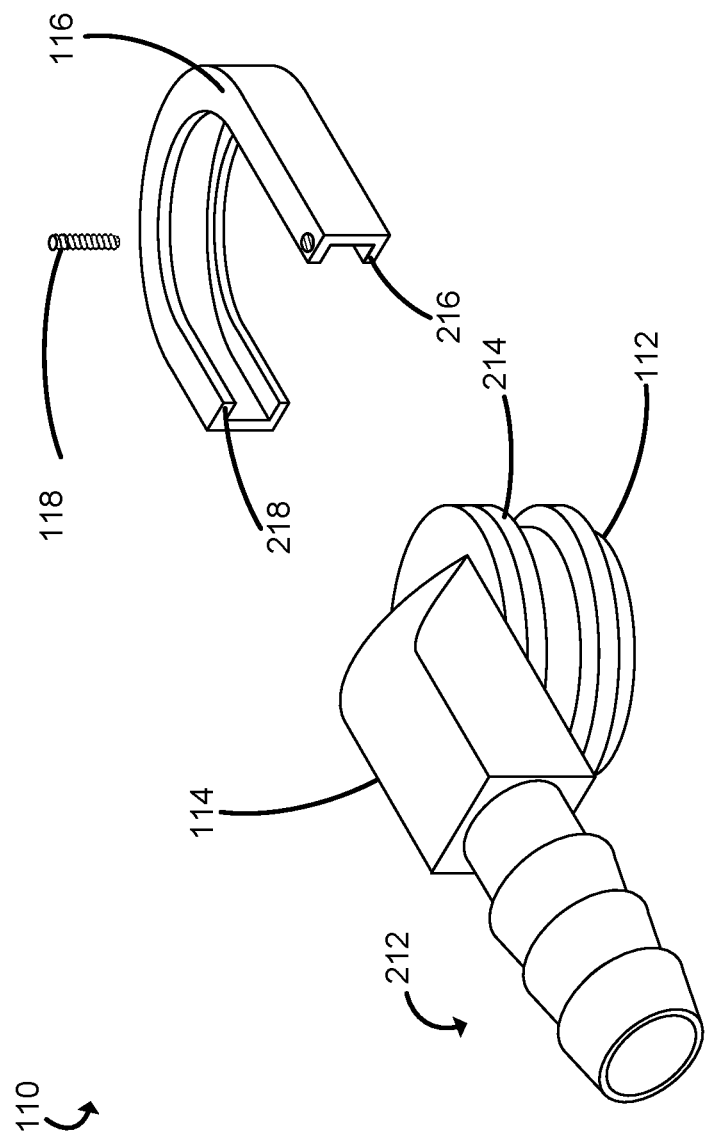
FIG. 4 is a perspective view of a partially assembled connector assembly of the system of FIG. 1.
Figure 5:
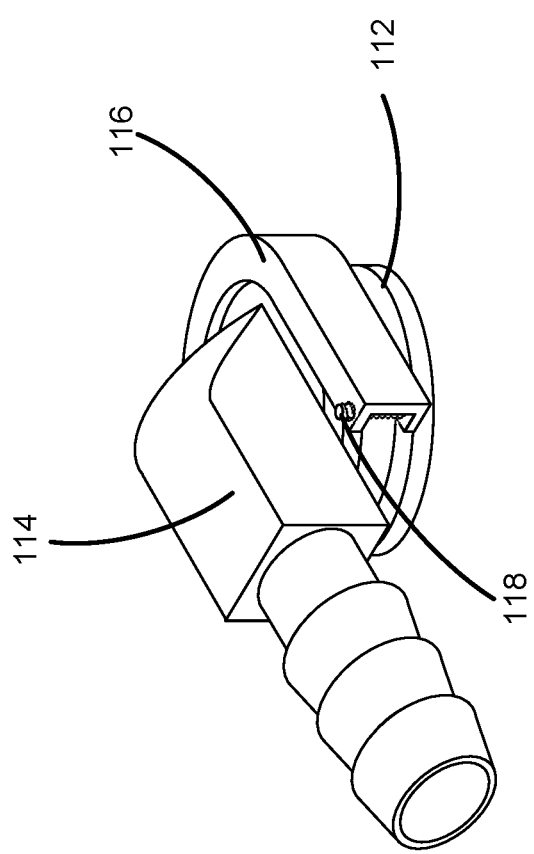
FIG. 5 is a perspective view of a connector assembly of the system of FIG. 1.

Referring now to FIGS. 3-5, in one embodiment, assembly of one embodiment of a connector assembly 110 is shown. A disassembled connector assembly 110 is shown in FIG. 3. The neck 210 of the fitting component 114 can be inserted into the stem component 112, as shown in FIG. 4. The collar 116 can then be positioned as shown in FIG. 5, with the top flange 218 of the collar 116 engaged with the fitting component 114 and the bottom flange 216 of the collar 116 engaged with the stem component 112. A set screw 118 or other retainer prevents the collar 116 from sliding off. The flanges 216, 218 of the collar 116 prevent the fitting component 114 from being removed from the stem component 112 when the collar 116 is in place. It should be appreciated that the collar 116 does not need to press the stem component 112 and the fitting component 114 together in order to maintain a water-tight seal. Rather, the seal is due to the O-rings 208 between the neck 210 of the fitting component 114 and the stem component 112.

Each of the components of the connector assembly 110 may be made of any suitable material. For example, each of the fitting component 114, the stem component 112, the collar 116, and the retainer 118 may be made from any suitable material, such as plastic, aluminum, steel, etc.

In the illustrative embodiment, the retainer 118 is a set screw that holds the collar 116 in place. The set screw 118 may screw into the top flange 218 and be screwed in until it contacts the bottom flange 216. In other embodiments, the retainer 118 may be a clip, pin, or any other suitable retainer 118. In some embodiments, the body of the collar 116 may act as a spring clip or c-clip, allowing the collar 116 to act as a retainer 118 by snapping into place when placed around the fitting component 114 and the stem component 112.

In the illustrative embodiment, the O-rings 208 (and other O-rings described herein) are made of ethylene propylene diene monomer (EPDM). In other embodiments, the O-rings 208 (and other O-rings described herein) may be made of any suitable material, such as rubber, silicone, plastic, etc. In the illustrative embodiment, the fitting component 114 and/ or the stem component 112 can rotate relative to the O-rings 208, even when the liquid cooling system is under pressure, allowing the fitting component 114 to rotate without breaking the seal created by the O-rings 208 between the fitting component 114 and the stem component 112.

The connector assembly 110 and any component thereof may have any suitable dimension. In the illustrative embodiment, when the connector assembly 110 is in place in the water block 106, the connector assembly 110 has a height less than 15 millimeters from the top surface of the base 108. More generally, the connector assembly 110 may have any suitable height as measured from the top surface of the base 108, such as 5-30 millimeters. The stem component 112 may have any suitable dimensions, such as a height of 5-30 millimeters, an inner diameter of 5-15 millimeters, and an outer diameter of 6-20 millimeters. The fitting component 114 may have any suitable dimensions, such as a height of 5-30 millimeters, an inner diameter of the neck 210 of 4-15 millimeters, an outer diameter of the neck 210 of 5-20 millimeters, an inner diameter of the tubing fitting 212 of 5-15 millimeters, and an outer diameter of the tubing fitting 212 of 6-20 millimeters.

In the illustrative embodiment, the fitting component 114 has a 90° elbow between the neck 210 and the tubing fitting 212. In other embodiments, the fitting component 114 may have an elbow at a different angle, such as 0-90°. In some embodiments, an elbow may not be included, and the tubing fitting 212 may be oriented parallel to the neck 210. The illustrative tubing fitting 212 is a barbed fitting which tubing 120 can be slid onto. In other embodiments, the tubing fitting 212 may be a press-fit type connector, a connector with a clip to secure tubing 120, or any other suitable fitting for tubing 120.

Figure 6:
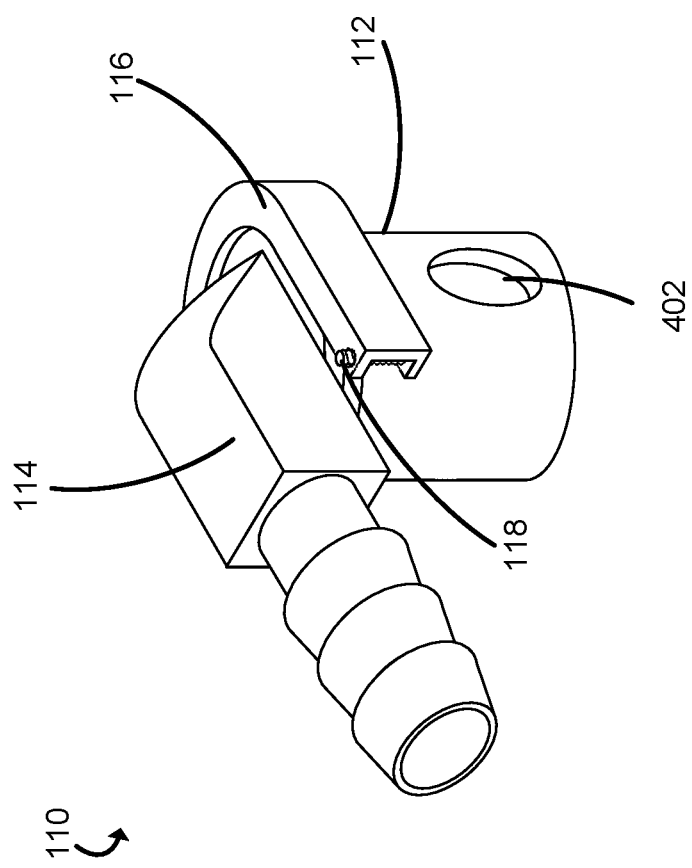
FIG. 6 is a perspective view of an alternate embodiment of a connector assembly of the system of FIG. 1.

In the illustrative embodiment, the stem component 112 is brazed to the base 108. In other embodiments, the stem component 112 may be fixed to the base 108 in a different way, such as by being screwed to the base 108. In the illustrative embodiment, the stem component 112 has an open bottom, allowing liquid to flow into and out of the tube extending from the base 108. It should be appreciated that other configurations of the stem component 112 are possible. For example, as shown in FIG. 6, in one embodiment, the stem component 112 may have an outlet hole 402 allowing liquid to flow into and out of a side of a tube.

Figure 7:
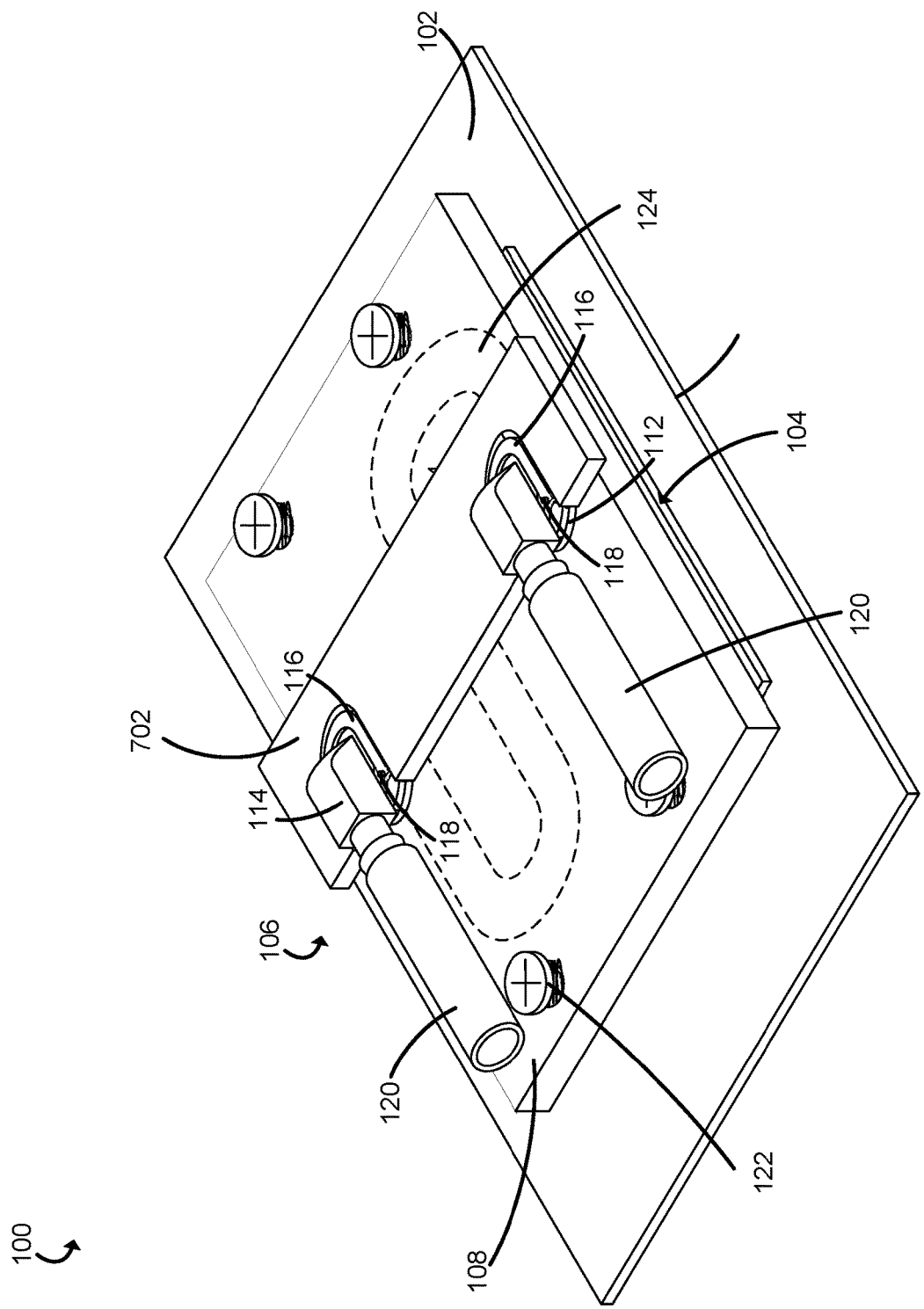
FIG. 7 is a perspective view of a simplified diagram of at least one embodiment of a computing system with a water block with rotatable tubing fittings a retention plate.
Figure 8:
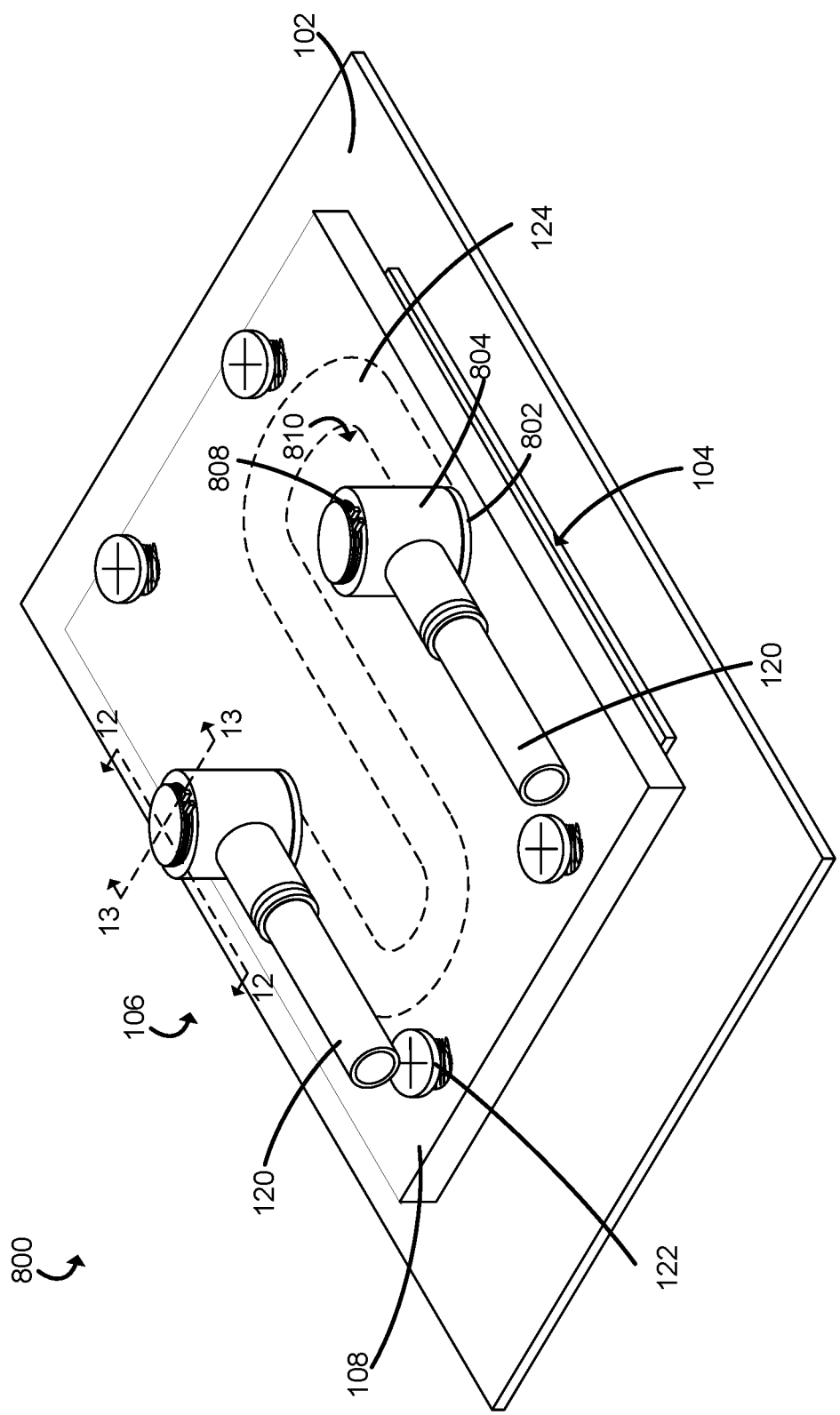
FIG. 8 is a perspective view of a simplified diagram of at least one embodiment of a computing system with a water block with rotatable tubing fittings.
Figure 9:
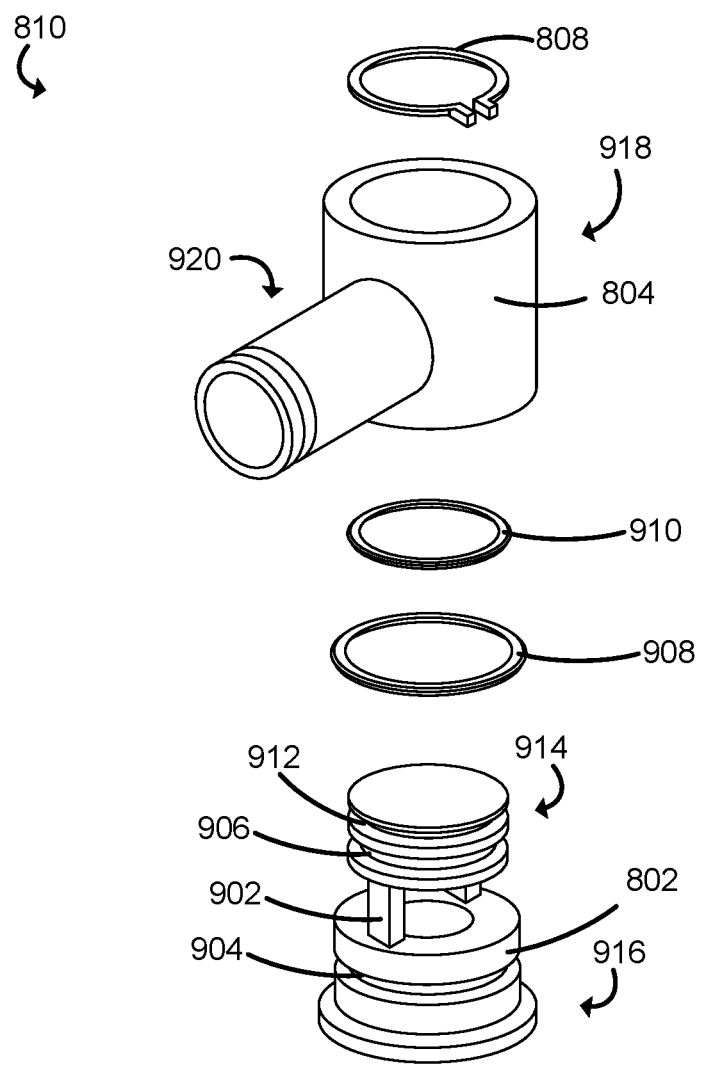
FIG. 9 is a perspective view of a disassembled connector assembly of the system of FIG. 8.

Referring now to FIG. 7, in one embodiment, a retention plate 702 may be positioned to hold the fitting components 114 in a particular orientation. In some embodiments, the retention plate 702 may have openings to retain fitting components 114 in different orientations relative to each other. It should be appreciated that, as the illustrative fitting component 114 can rotate to any orientation, the same fitting component can be used in each connector assembly 110, even if different fitting components 114 are to be held to different orientations by the retention plate 702.

Referring now to FIGS. 8-13, in one embodiment, a system 800 includes several components similar to those of the system 100 and a different rotatable connector assembly 810. For example, the system board 102, the integrated circuit component 104, water block 106, tubing 120, etc., may be similar or the same in the system 800 as the system 100. In the interest of clarity, a description of the similar components will not be repeated. The connector assembly 810 is shown disassembled in FIG. 9. The connector assembly 810 includes a stem component 802, a fitting component 804, a lower O-ring 908, an upper O-ring 910, and a retainer 808. The fitting component 804 has a cylindrical housing 918 into which the stem component 802 can be inserted. The fitting component 804 also has a tubing fitting 920 that can fluidly couple the fit connector assembly 810 to tubing 120.

Figure 10:
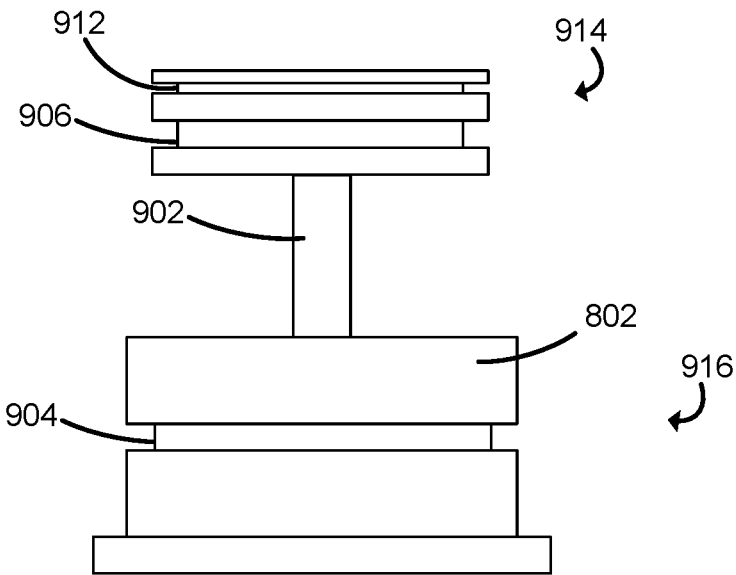
FIG. 10 is a side view of one component of the connector assembly of the system of FIG. 8.
Figure 11:
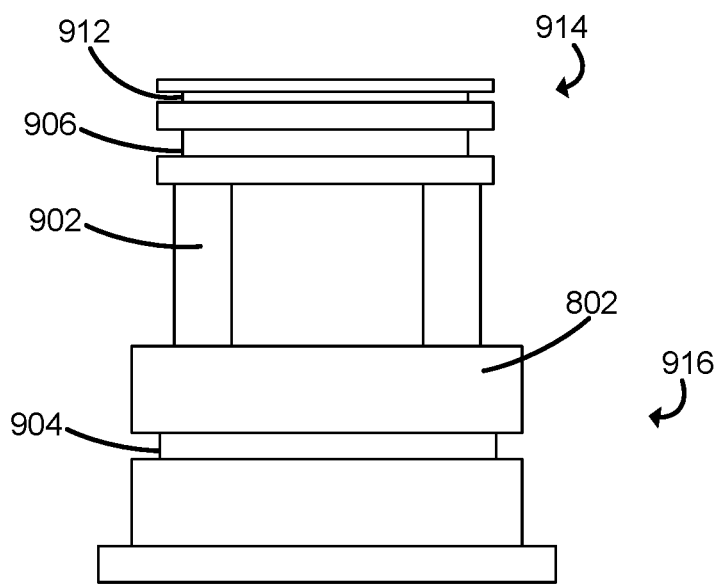
FIG. 11 is a front view of one component of the connector assembly of the system of FIG. 8.
Figure 12:
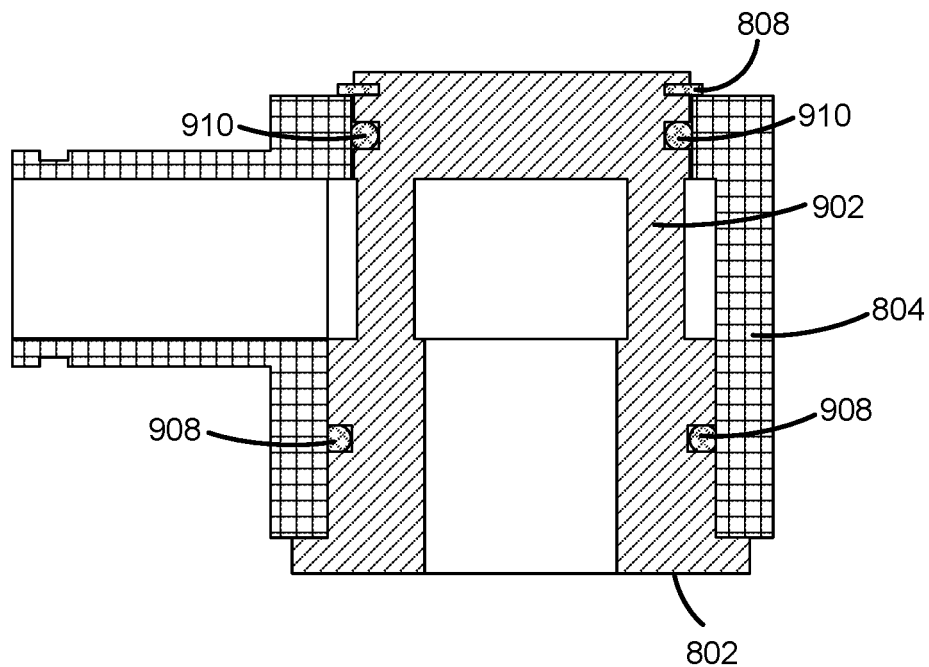
FIG. 12 is a cross-section of one embodiment of the connector assembly of the system of FIG. 8.
Figure 13:
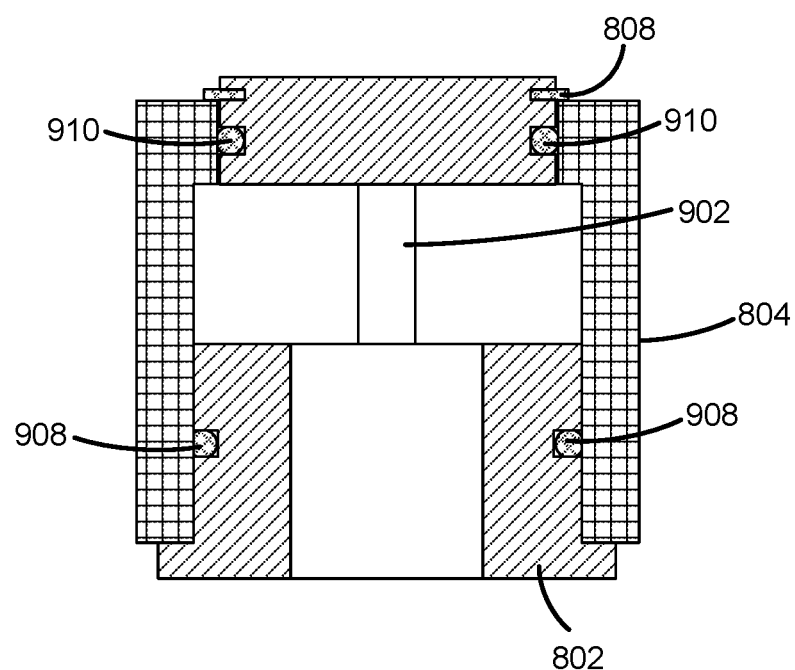
FIG. 13 is a cross-section of one embodiment of the connector assembly of the system of FIG. 8.
Figure 14:
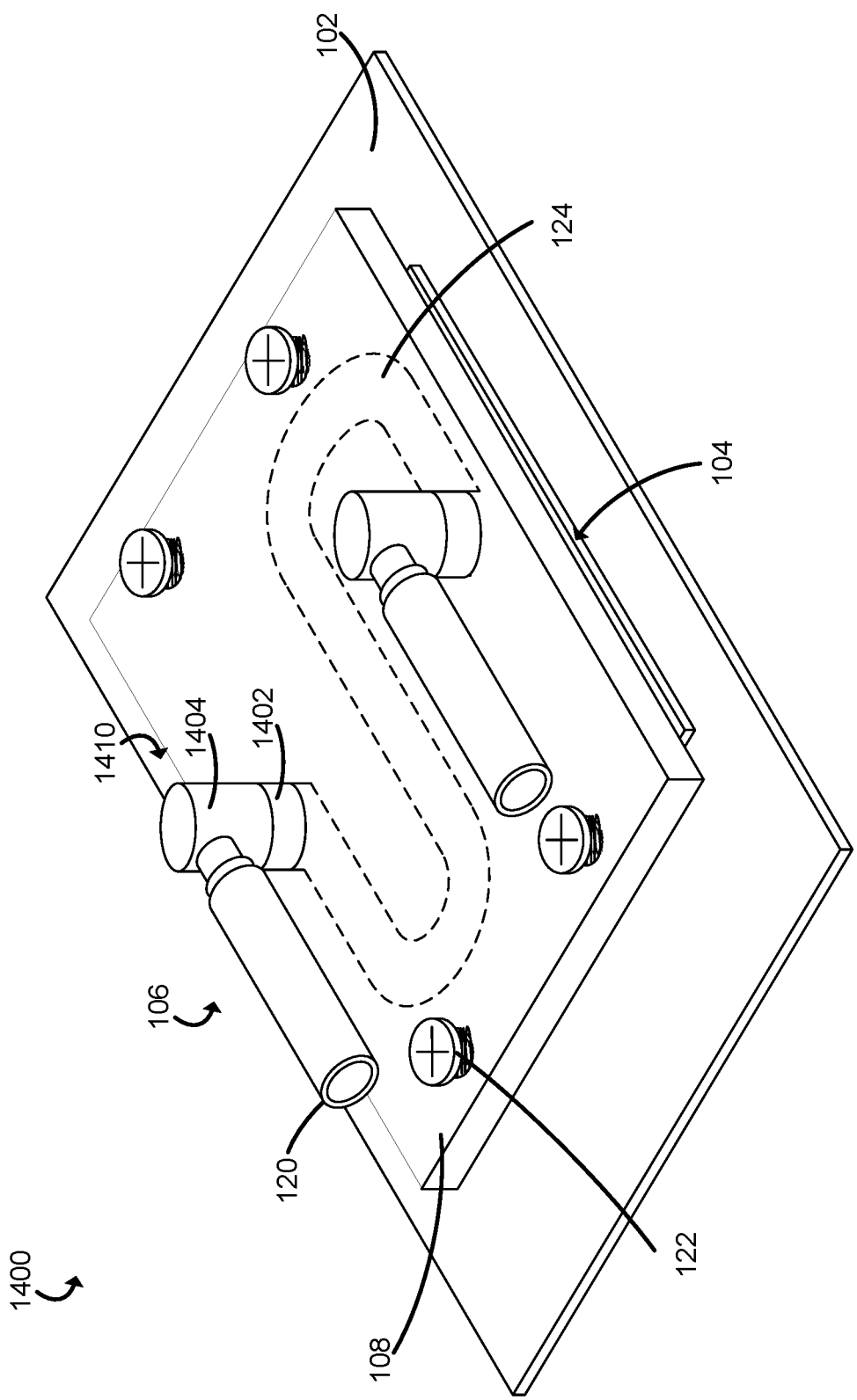
FIG. 14 is a perspective view of a simplified diagram of at least one embodiment of a computing system with a water block with rotatable tubing fittings.

FIG. 10 shows a side view of the stem component 802, and FIG. 11 shows a front view of the stem component 802. FIG. 12 shows a cross-section view (corresponding to view 12 marked in FIG. 8), and FIG. 13 shows a cross-section view (corresponding to view 13 marked in FIG. 8). The stem component 802 has one or more pillars 902 connecting an upper part 914 of the stem component 802 and a lower part 916 of the stem component 802. The lower part 916 of the stem component 802 is in the form of a tube that, when fixed to the base 108, extends from the base 108 toward the fitting component 804, The upper part 914 of the stem component 802 acts as a cap or lid, preventing water or other cooling liquid from flowing out of the top of the stem component 802. When the connector assembly 810 is in place on the water block 106, water or other cooling liquid can flow from the water block 106 into the tube of the lower part 916 of the stem component 802. The cooling liquid can then flow out of the lower part 916, around and through the pillars 902, and into the tubing fitting 920 of the fitting component 804. In the illustrative embodiment, the housing 918 surrounds the stem component 802, with the upper part 914 of the stem component 802 extending out an upper end of the housing 918 and the lower part 916 of the stem component 802 extending out a lower end of the housing 918, as shown in FIGS. 12 & 13.

In the illustrative embodiment, the cooling liquid is water, such as deionized water. In other embodiments, other fluids may be used, such as alcohol, glycol, and/or any other suitable fluid or mix of fluids. The water or other cooling liquid may have certain additives such as anti-microbial additives. It should be appreciated that, in some embodiments, the water block 106 may have liquid coolant in it other than water, despite the name.

The lower O-ring 908 is configured to be positioned in slot 904 of the stem component 802, and the upper O-ring 910 is configured to be positioned in slot 906 of the stem component 802. The retainer 808 is configured to mate with a part of the stem component 802, such as a part of the stem component 802 that extends past a top of the fitting component 804. In the illustrative embodiment, a circular slot 912 is defined in an outside surface of the upper part 914 of the stem component 802 that extends around an outer circumference of the upper part 914. A C-clip 808 mates with the slot 912 in the stem component 802, which prevents the fitting component 804 from being removed while the C-clip 808 is in place. In other embodiments, the retainer 808 may be, e.g., a set screw, a pin, or any other suitable retainer 808. It should be appreciated that the O-rings 908, 910 form a water-tight seal, preventing the water or other cooling liquid from leaking. As such, the retainer 808 does not need to press the stem component 802 and fitting component 804 together to maintain the seal.

In the illustrative embodiment, the upper O-ring 910 has a smaller diameter than the lower O-ring 908. As a result, the number of compression cycles the upper O-ring 910 will experience during installation of the fitting component 804 is reduced, mitigating the possibility of damage to the upper O-ring 910.

In use, the fitting component 804 is rotatable relative to the stem component 802. The gap between the upper part 914 and the lower part 916 of the stem component 802 (which are only connected by the pillars 902) allows water or other liquid to flow into and out of the tubing fitting 920 regardless of the orientation of the tubing fitting 920. The O-rings 908, 910 may rotate with the fitting component 804 or may stay stationary relative to the stem component 802. It should be appreciated that, in the illustrative embodiment, the O-rings 908, 910 maintain a seal while the fitting component 804 is being rotated.

The connector assembly 810 and any component thereof may have any suitable dimension. In the illustrative embodiment, when the connector assembly 810 is in place in the water block 106, the connector assembly 810 has a height less than 15 millimeters from the top surface of the base 108. More generally, the connector assembly 810 may have any suitable height as measured from the top surface of the base 108, such as 5-30 millimeters. The stem component 802 may have any suitable dimensions, such as a height of 5-30 millimeters, an inner diameter of 5-15 millimeters, and an outer diameter of 6-20 millimeters. The fitting component 804 may have any suitable dimensions, such as a height of 5-30 millimeters, an inner diameter of the housing 918 of 5-15 millimeters, an outer diameter of the housing 918 of 6-20 millimeters, an inner diameter of the tubing fitting 920 of 5-15 millimeters, and an outer diameter of the tubing fitting 920 of 6-20 millimeters.

In the illustrative embodiment, the fitting component 804 has a 90° elbow between the housing 918 and the tubing fitting 920. In other embodiments, the fitting component 804 may have an elbow at a different angle, such as 10-90°. In some embodiments, an elbow may not be included, and the tubing fitting 920 may be oriented parallel to the housing 918. The illustrative tubing fitting 920 is a press-fit type connector which tubing 120 can be pressed into. In other embodiments, the tubing fitting 920 may be a barbed connector, a connector with a clip to secure tubing 120, or any other suitable fitting for tubing 120.

In the illustrative embodiment, the stem component 802 is brazed to the base 108. In other embodiments, the stem component 802 may be fixed to the base 108 in a different way, such as by being screwed to the base 108.

Referring now to FIGS. 14-19, in one embodiment, a system 1400 includes several components similar to those of the system 100 and a different rotatable connector assembly 1410. For example, the system board 102, the integrated circuit component 104, water block 106, tubing 120, etc., may be similar or the same in the system 1400 as the system 100. In the interest of clarity, a description of the similar components will not be repeated.

Figure 15:
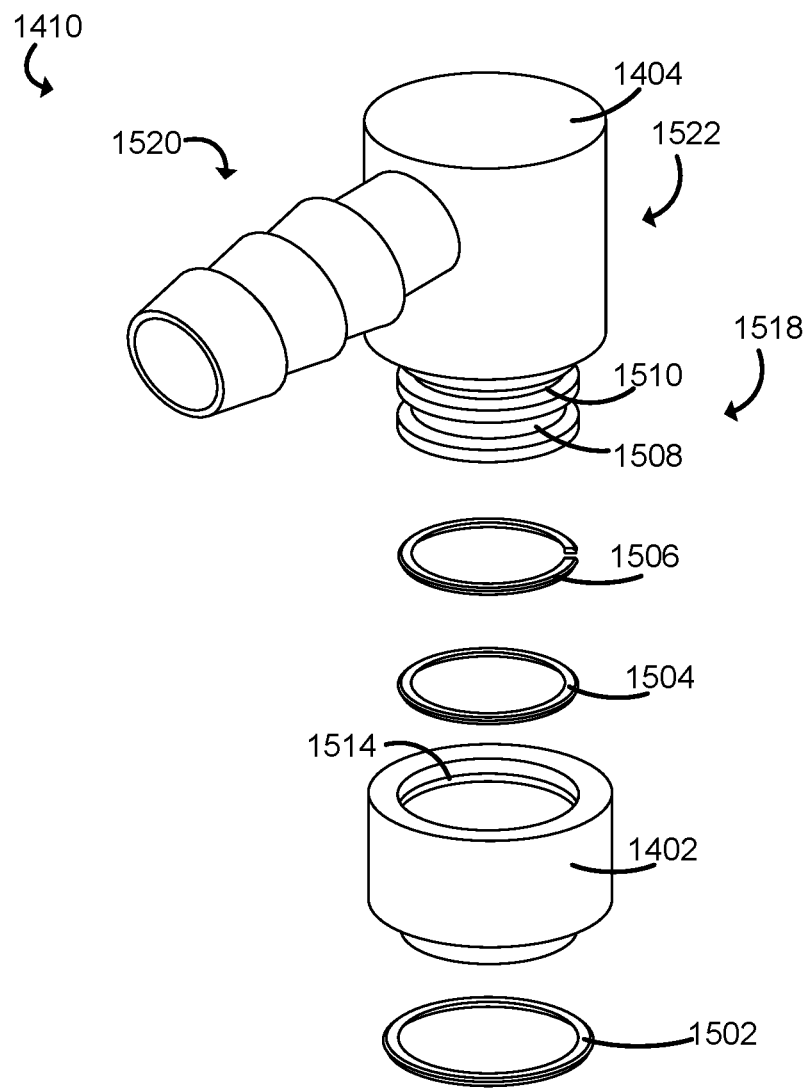
FIG. 15 is a perspective view of a disassembled connector assembly of the system of FIG. 14.

The illustrative connector assembly 1410 is shown disassembled in FIG. 15. The illustrative connector assembly 1410 includes a stem component 1402, a fitting component 1404, a lower O-ring 1502, an upper O-ring 1504, and a retainer 1506. In use, in the illustrative embodiment, the stem component 1402 is fixed to the base 108 of the water block 106. The illustrative stem component 1402 includes a tube extending from the base 108 toward the fitting component 1404, and the tube is fluidly coupled to the internal channel 124 of the base 108. The fitting component 1404 includes a neck 1518 at one end that extends into the tube of the stem component 1402 when the connector assembly 1410 is assembled, causing the fitting component 1404 to be fluidly coupled to the stem component 1402. The fitting component 1404 includes a tubing fitting 1520 that can mate with tubing 120. The tubing fitting 1520 is connected to the neck 1518 by a housing 1522.

The stem component 1402 has a circular slot 1514 defined on an inside surface that extends around an inner circumference of the tube. The fitting component 1404 has a circular slot 1510 defined on an outside surface of the neck 1518 that extends around an outer circumference of the neck 1518. When assembled, the C-clip is positioned in both slots 1510, 1514 at the same time, preventing the fitting component 1404 from being separated from the stem component 1402.

In the illustrative embodiment, the lower O-ring 1502 is positioned between the stem component 1402 and the base 108. In the illustrative embodiment, the stem component 1402 is screwed into a threaded hole in the base 108, and the lower O-ring 1502 creates a water-tight seal between the base 108 and the stem component 1402. In other embodiments, the stem component 1402 may be brazed or otherwise permanently fixed to the base 108. The fitting component 1404 has a slot 1508 for the upper O-ring 1504, which, in the illustrative embodiment, creates a seal between the stem component 1402 and the fitting component 1404.

Figure 16:
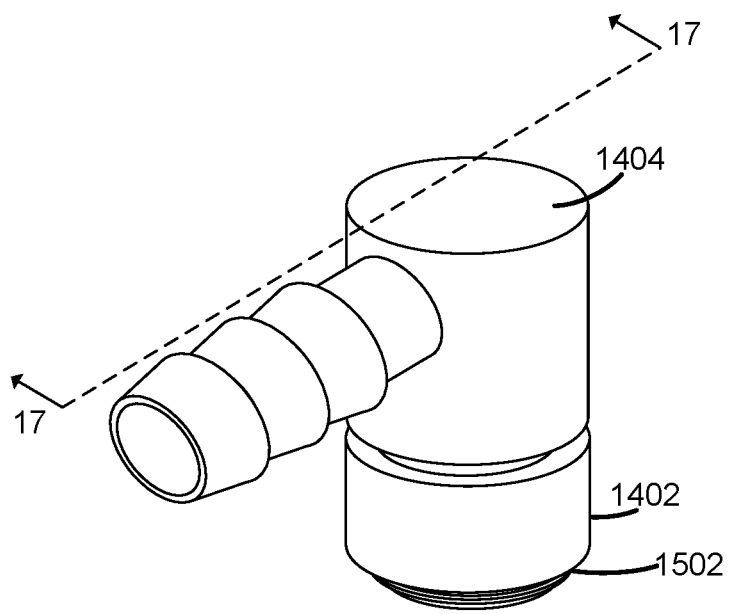
FIG. 16 is a perspective view of one embodiment of a partially assembled connector assembly of the system of FIG. 14.
Figure 17:
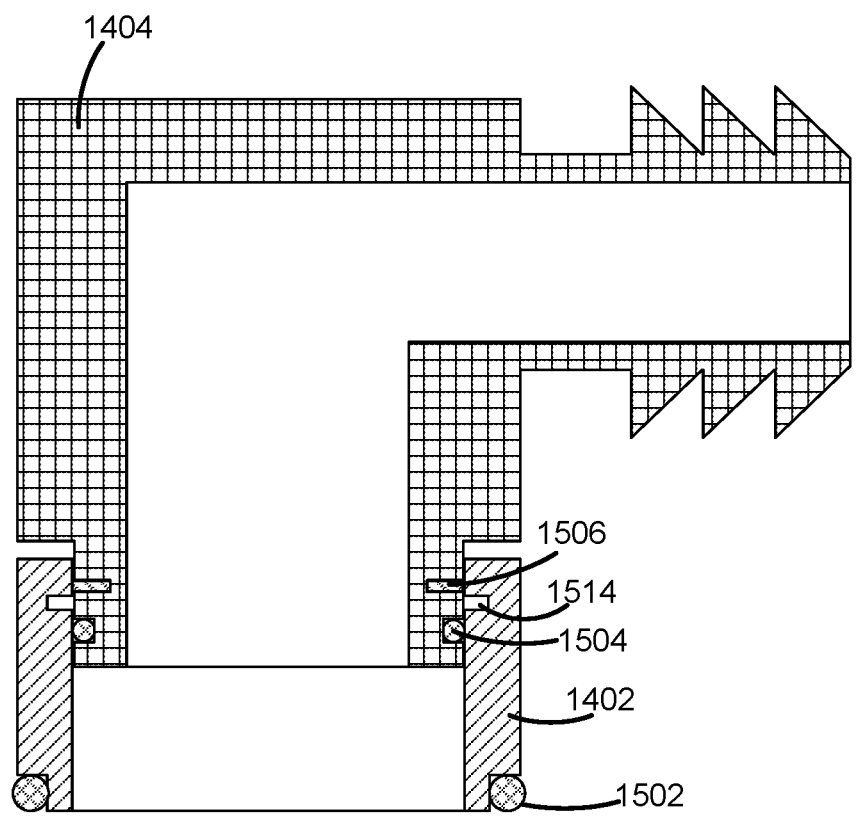
FIG. 17 is a cross-section view of the partially assembled connector assembly of FIG. 16.
Figure 18:
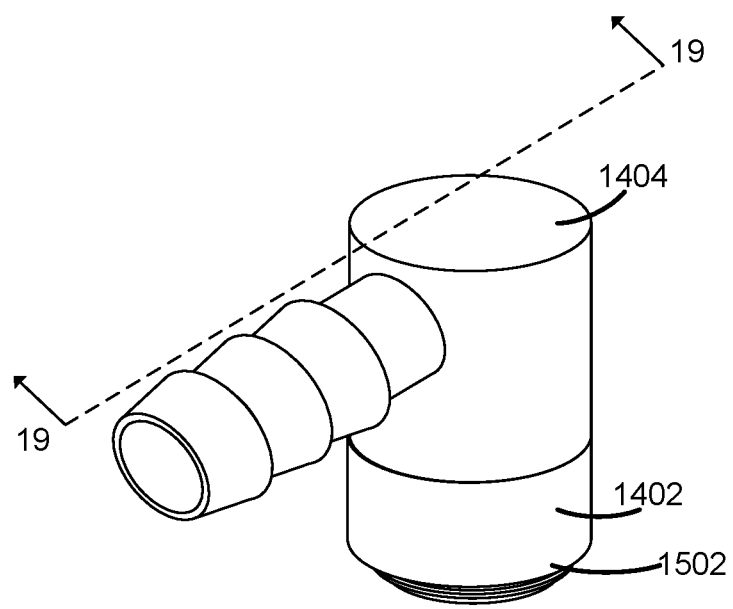
FIG. 18 is a perspective view of one embodiment of an assembled connector assembly of the system of FIG. 14.
Figure 19:
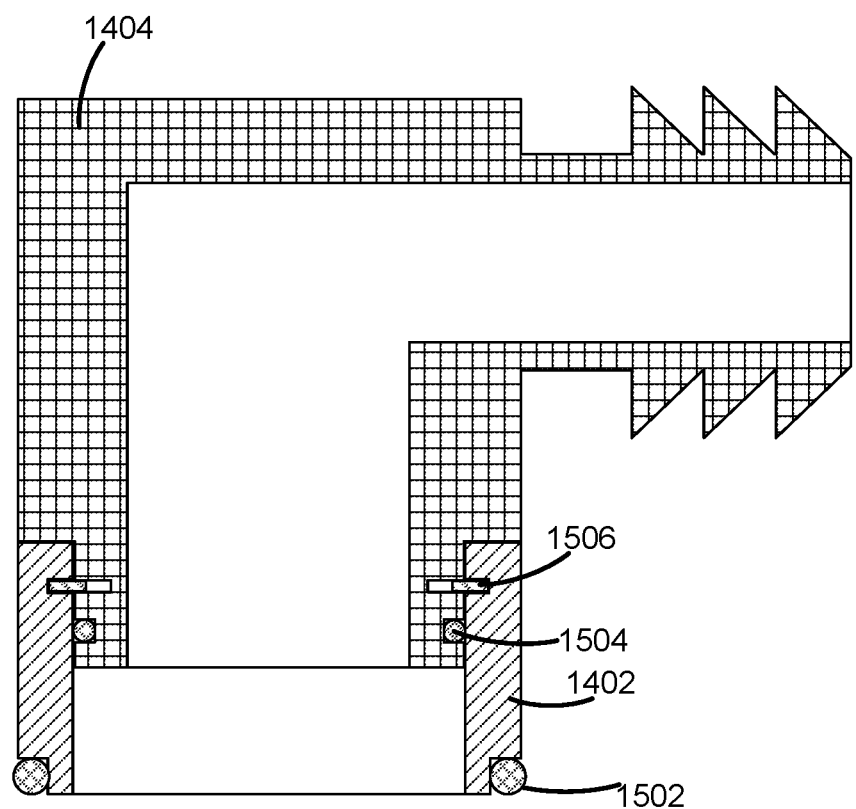
FIG. 19 is a cross-section view of the partially assembled connector assembly of FIG. 18.

Referring now to FIGS. 16-19, to assemble the connector assembly 1410, the fitting component 1404 is inserted into the stem component 1402, as shown in FIG. 16. FIG. 17 shows a cross-section view of FIG. 16, corresponding to the view 17 marked in FIG. 16. The illustrative retainer 1506 has a diameter that is larger than the inner diameter of the stem component 1402. However, the illustrative retainer 1506 is a C-clip with a gap. In order to fit the retainer 1506 inside the stem component 1402, the ends of the gap in the retainer 1506 are pressed together, shrinking the diameter of the C-clip 1506 and allowing the C-clip 1506 to fit in the stem component 1402, as shown in FIGS. 16 & 17. As the fitting component 1404 is fully inserted into the stem component 1402, the C-clip 1506 lines up with the slot 1514 in the stem component 1402. The C-clip then springs back into its normal diameter (i.e., its diameter without compression) into the slot 1514, as shown in FIGS. 18 & 19. In the illustrative embodiment, the fitting component 1404 is now permanently attached to the stem component 1402, as the retainer 1506 cannot be compressed in order for the fitting component 1404 to be removed. In other embodiments, there may be one or more openings to allow for the C-clip 1506 to be compressed, allowing the fitting component 1404 to be removed from the stem component 1402.

In use, the fitting component 1404 is rotatable relative to the stem component 1402. The O-rings 1502, 1504 may rotate with the fitting component 1404 or may stay stationary relative to the stem component 1402. It should be appreciated that, in the illustrative embodiment, the O-rings 1502, 1504 maintain a seal while the fitting component 1404 is being rotated.

The connector assembly 1410 and any component thereof may have any suitable dimension. In the illustrative embodiment, when the connector assembly 1410 is in place in the water block 106, the connector assembly 1410 has a height less than 15 millimeters from the top surface of the base 108. More generally, the connector assembly 1410 may have any suitable height as measured from the top surface of the base 108, such as 5-15 millimeters. The stem component 1402 may have any suitable dimensions, such as a height of 2-5 millimeters, an inner diameter of 4-10 millimeters, and an outer diameter of 6-20 millimeters. The fitting component 1404 may have any suitable dimensions, such as a height of 5-10 millimeters, an inner diameter of the neck 1518 of 4-10 millimeters, an outer diameter of the neck 1518 of 6-20 millimeters, an inner diameter of the tubing fitting 1520 of 4-8 millimeters, and an outer diameter of the tubing fitting 1520 of 6-10 millimeters.

In the illustrative embodiment, the fitting component 1404 has a 90° elbow between the housing 1522 and the tubing fitting 1520. In other embodiments, the fitting component 1404 may have an elbow at a different angle, such as 10-90°. In some embodiments, an elbow may not be included, and the tubing fitting 1520 may be oriented parallel to the housing 1522. The illustrative tubing fitting 1520 is a barbed fitting which tubing 120 can be slid onto. In other embodiments, the tubing fitting 1520 may be a press-fit type connector, a connector with a clip to secure tubing 120, or any other suitable fitting for tubing 120.

It should be appreciated that the embodiments described above are merely exemplary embodiments, and other embodiments are envisioned as well, such as embodiments with features of one embodiment present in another embodiment. For example, in some embodiments, some of the O-rings described above may be omitted, any of the embodiments described above may a stem component with an outlet hole allowing liquid to flow into and out of a side of a tube as shown in FIG. 6. As another example, any of the O-rings described herein may be an O-ring with non-circular cross-sections such as O-rings with multiple lobes. As another example, a retention plate 702 may be used with any embodiment or different combination of embodiments of rotatable connector assemblies disclosed herein. In some embodiments, the O-rings and other components may be able to withstand high pressure for short periods of time without bursting or leaking. For example, any or all of the embodiments may be able to withstand a pressure in the water or other cooling liquid of 200 psi for two minutes without any leakage. In the illustrative embodiment, each material that will contact the cooling fluid is compatible with the fluid, and will not corrode, dissolve, crack, etc. Each of the materials that will contact the cooling fluid may be on a wetted materials list. It should be appreciated that some components, such as the collar 116, the retainer 808, the retainer 1506, etc., do not contact the cooling fluid under standard operating conditions and do not need to be compatible with prolonged fluid contact.

The technologies described herein can be performed by or implemented in any of a variety of computing systems, including mobile computing systems (e.g., smartphones, handheld computers, tablet computers, laptop computers, portable gaming consoles, 2-in-1 convertible computers, portable all-in-one computers), non-mobile computing systems (e.g., desktop computers, servers, workstations, stationary gaming consoles, set-top boxes, smart televisions, rack-level computing solutions (e.g., blades, trays, sleds)), and embedded computing systems (e.g., computing systems that are part of a vehicle, smart home appliance, consumer electronics product or equipment, manufacturing equipment). As used herein, the term "computing system" includes computing devices and includes systems comprising multiple discrete physical components. In some embodiments, the computing systems are located in a data center, such as an enterprise data center (e.g., a data center owned and operated by a company and typically located on company premises), managed services data center (e.g., a data center managed by a third party on behalf of a company), a collocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves).

Figure 20:
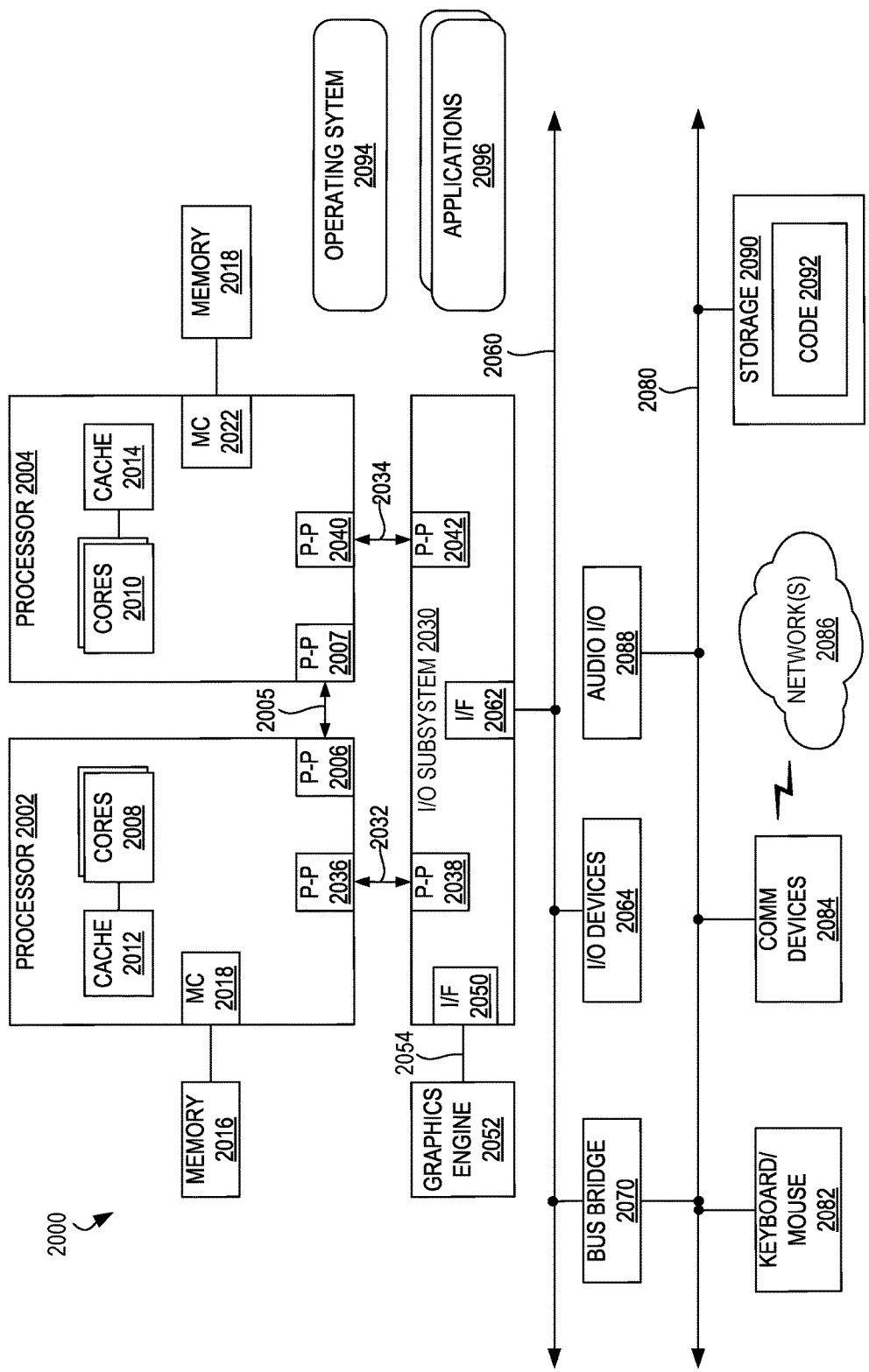
FIG. 20 is a block diagram of an exemplary computing system in which technologies described herein may be implemented.

FIG. 20 is a block diagram of a second example computing system in which technologies described herein may be implemented. Generally, components shown in FIG. 20 can communicate with other shown components, although not all connections are shown, for ease of illustration. The computing system 2000 is a multiprocessor system comprising a first processor unit 2002 and a second processor unit 2004 comprising point-to-point (P-P) interconnects. A point-to-point (P-P) interface 2006 of the processor unit 2002 is coupled to a point-to-point interface 2007 of the processor unit 2004 via a point-to-point interconnection 2005. It is to be understood that any or all of the point-to-point interconnects illustrated in FIG. 20 can be alternatively implemented as a multi-drop bus, and that any or all buses illustrated in FIG. 20 could be replaced by point-to-point interconnects.

The processor units 2002 and 2004 comprise multiple processor cores. Processor unit 2002 comprises processor cores 2008 and processor unit 2004 comprises processor cores 2010. Processor cores 2008 and 2010 can execute computer-executable instructions.

Processor units 2002 and 2004 further comprise cache memories 2012 and 2014, respectively. The cache memories 2012 and 2014 can store data (e.g., instructions) utilized by one or more components of the processor units 2002 and 2004, such as the processor cores 2008 and 2010. The cache memories 2012 and 2014 can be part of a memory hierarchy for the computing system 2000. For example, the cache memories 2012 can locally store data that is also stored in a memory 2016 to allow for faster access to the data by the processor unit 2002. In some embodiments, the cache memories 2012 and 2014 can comprise multiple cache levels, such as level 1 (L1), level 2 (L2), level 3 (L3), level 4 (L4), and/or other caches or cache levels, such as a last level cache (LLC). Some of these cache memories (e.g., L2, L3, L4, LLC) can be shared among multiple cores in a processor unit. One or more of the higher levels of cache levels (the smaller and faster caches) in the memory hierarchy can be located on the same integrated circuit die as a processor core and one or more of the lower cache levels (the larger and slower caches) can be located on an integrated circuit dies that are physically separate from the processor core integrated circuit dies.

Although the computing system 2000 is shown with two processor units, the computing system 2000 can comprise any number of processor units. Further, a processor unit can comprise any number of processor cores. A processor unit can take various forms such as a central processing unit (CPU), a graphics processing unit (GPU), general-purpose GPU (GPGPU), accelerated processing unit (APU), field-programmable gate array (FPGA), neural network processing unit (NPU), data processor unit (DPU), accelerator (e.g., graphics accelerator, digital signal processor (DSP), compression accelerator, artificial intelligence (AI) accelerator), controller, or other types of processing units. As such, the processor unit can be referred to as an XPU (or xPU). Further, a processor unit can comprise one or more of these various types of processing units. In some embodiments, the computing system comprises one processor unit with multiple cores, and in other embodiments, the computing system comprises a single processor unit with a single core. As used herein, the terms "processor unit" and "processing unit" can refer to any processor, processor core, component, module, engine, circuitry, or any other processing element described or referenced herein.

In some embodiments, the computing system 2000 can comprise one or more processor units that are heterogeneous or asymmetric to another processor unit in the computing system. There can be a variety of differences between the processing units in a system in terms of a spectrum of metrics of merit including architectural, microarchitectural, thermal, power consumption characteristics, and the like. These differences can effectively manifest themselves as asymmetry and heterogeneity among the processor units in a system.

The processor units 2002 and 2004 can be located in a single integrated circuit component (such as a multi-chip package (MCP) or multi-chip module (MCM)) or they can be located in separate integrated circuit components. An integrated circuit component comprising one or more processor units can comprise additional components, such as embedded DRAM, stacked high bandwidth memory (HBM), shared cache memories (e.g., L3, L4, LLC), input/output (I/O) controllers, or memory controllers. Any of the additional components can be located on the same integrated circuit die as a processor unit, or on one or more integrated circuit dies separate from the integrated circuit dies comprising the processor units. In some embodiments, these separate integrated circuit dies can be referred to as "chiplets". In some embodiments where there is heterogeneity or asymmetry among processor units in a computing system, the heterogeneity or asymmetric can be among processor units located in the same integrated circuit component.

Processor units 2002 and 2004 further comprise memory controller logic (MC) 2020 and 2022. As shown in FIG. 20, MCs 2020 and 2022 control memories 2016 and 2018 coupled to the processor units 2002 and 2004, respectively. The memories 2016 and 2018 can comprise various types of volatile memory (e.g., dynamic random-access memory (DRAM), static random-access memory (SRAM)) and/or non-volatile memory (e.g., flash memory, chalcogenide-based phase-change non-volatile memories), and comprise one or more layers of the memory hierarchy of the computing system. While MCs 2020 and 2022 are illustrated as being integrated into the processor units 2002 and 2004, in alternative embodiments, the MCs can be external to a processor unit.

Processor units 2002 and 2004 are coupled to an Input/Output (I/O) subsystem 2030 via point-to-point interconnections 2032 and 2034. The point-to-point interconnection 2032 connects a point-to-point interface 2036 of the processor unit 2002 with a point-to-point interface 2038 of the I/O subsystem 2030, and the point-to-point interconnection 2034 connects a point-to-point interface 2040 of the processor unit 2004 with a point-to-point interface 2042 of the I/O subsystem 2030. Input/Output subsystem 2030 further includes an interface 2050 to couple the I/O subsystem 2030 to a graphics engine 2052. The I/O subsystem 2030 and the graphics engine 2052 are coupled via a bus 2054.

The Input/Output subsystem 2030 is further coupled to a first bus 2060 via an interface 2062. The first bus 2060 can be a Peripheral Component Interconnect Express (PCIe) bus or any other type of bus. Various I/O devices 2064 can be coupled to the first bus 2060. A bus bridge 2070 can couple the first bus 2060 to a second bus 2080. In some embodiments, the second bus 2080 can be a low pin count (LPC) bus. Various devices can be coupled to the second bus 2080 including, for example, a keyboard/mouse 2082, audio I/O devices 2088, and a storage device 2090, such as a hard disk drive, solid-state drive, or another storage device for storing computer-executable instructions (code) 2092 or data. The code 2092 can comprise computer-executable instructions for performing methods described herein. Additional components that can be coupled to the second bus 2080 include communication device(s) 2084, which can provide for communication between the computing system 2000 and one or more wired or wireless networks 2086 (e.g. Wi-Fi, cellular, or satellite networks) via one or more wired or wireless communication links (e.g., wire, cable, Ethernet connection, radio-frequency (RF) channel, infrared channel, Wi-Fi channel) using one or more communication standards (e.g., IEEE 802.11 standard and its supplements).

In embodiments where the communication devices 2084 support wireless communication, the communication devices 2084 can comprise wireless communication components coupled to one or more antennas to support communication between the computing system 2000 and external devices. The wireless communication components can support various wireless communication protocols and technologies such as Near Field Communication (NFC), IEEE 1002.11 (Wi-Fi) variants, WiMax, Bluetooth, Zigbee, 4G Long Term Evolution (LTE), Code Division Multiplexing Access (CDMA), Universal Mobile Telecommunication System (UMTS) and Global System for Mobile Telecommunication (GSM), and 5G broadband cellular technologies. In addition, the wireless modems can support communication with one or more cellular networks for data and voice communications within a single cellular network, between cellular networks, or between the computing system and a public switched telephone network (PSTN).

The system 2000 can comprise removable memory such as flash memory cards (e.g., SD (Secure Digital) cards), memory sticks, Subscriber Identity Module (SIM) cards). The memory in system 2000 (including caches 2012 and 2014, memories 2016 and 2018, and storage device 2090) can store data and/or computer-executable instructions for executing an operating system 2094 and application programs 2096. Example data includes web pages, text messages, images, sound files, and video data to be sent to and/or received from one or more network servers or other devices by the system 2000 via the one or more wired or wireless networks 2086, or for use by the system 2000. The system 2000 can also have access to external memory or storage (not shown) such as external hard drives or cloud-based storage.

The operating system 2094 can control the allocation and usage of the components illustrated in FIG. 20 and support the one or more application programs 2096. The application programs 2096 can include common computing system applications (e.g., email applications, calendars, contact managers, web browsers, messaging applications) as well as other computing applications.

The computing system 2000 can support various additional input devices, such as a touchscreen, microphone, monoscopic camera, stereoscopic camera, trackball, touchpad, trackpad, proximity sensor, light sensor, electrocardiogram (ECG) sensor, PPG (photoplethysmogram) sensor, galvanic skin response sensor, and one or more output devices, such as one or more speakers or displays. Other possible input and output devices include piezoelectric and other haptic I/O devices. Any of the input or output devices can be internal to, external to, or removably attachable with the system 2000. External input and output devices can communicate with the system 2000 via wired or wireless connections.

In addition, the computing system 2000 can provide one or more natural user interfaces (NUIs). For example, the operating system 2094 or applications 2096 can comprise speech recognition logic as part of a voice user interface that allows a user to operate the system 2000 via voice commands. Further, the computing system 2000 can comprise input devices and logic that allows a user to interact with computing the system 2000 via body, hand, or face gestures.

The system 2000 can further include at least one input/output port comprising physical connectors (e.g., USB, IEEE 1394 (FireWire), Ethernet, RS-232), a power supply (e.g., battery), a global satellite navigation system (GNSS) receiver (e.g., GPS receiver); a gyroscope; an accelerometer; and/or a compass. A GNSS receiver can be coupled to a GNSS antenna. The computing system 2000 can further comprise one or more additional antennas coupled to one or more additional receivers, transmitters, and/or transceivers to enable additional functions.

It is to be understood that FIG. 20 illustrates only one example computing system architecture. Computing systems based on alternative architectures can be used to implement technologies described herein. For example, instead of the processor units 2002 and 2004 and the graphics engine 2052 being located on discrete integrated circuits, a computing system can comprise an SoC (system-on-a-chip) integrated circuit incorporating multiple processors, a graphics engine, and additional components. Further, a computing system can connect its constituent component via bus or point-to-point configurations different from that shown in FIG. 20. Moreover, the illustrated components in FIG. 20 are not required or all-inclusive, as shown components can be removed and other components added in alternative embodiments.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and in the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

EXAMPLES

Illustrative examples of the technologies disclosed herein are provided below. An embodiment of the technologies may include any one or more, and any combination of, the examples described below.

Example 1 includes an apparatus comprising a water block comprising a base, the water block comprising a first connector assembly and a second connector assembly, wherein the first connector assembly is fluidly coupled to the second connector assembly by an internal channel defined in the water block, wherein the first connector assembly comprises a stem component and a fitting component, wherein the stem component is fixed to the base, wherein the stem component comprises a tube extending from the base toward the fitting component, wherein the stem component comprises a flange extending from the tube, wherein the fitting component comprises a neck extending into the tube of the stem component to fluidly couple to the stem component, wherein the fitting component comprises a tubing fitting to fluidly couple to tubing, wherein the fitting component is able to rotate relative to the stem component, further comprising a collar, the collar comprising a collar body configured to wrap at least partially around the stem component and the fitting component; a first flange extending from the collar body to engage with the flange of the stem component; and a second flange extending from the collar body to engage with the fitting component, the first flange and the second flange to prevent separation of the stem component and the fitting component.

Example 2 includes the subject matter of Example 1, and wherein the collar further comprises a retainer to hold the collar in place.

Example 3 includes the subject matter of any of Examples 1 and 2, and wherein the retainer is a set screw that is screwed into the first flange and contacts the second flange.

Example 4 includes the subject matter of any of Examples 1-3, and further including one or more O-rings positioned between the stem component and the fitting component, wherein the one or more O-rings create a water-tight seal between the stem component and the fitting component.

Example 5 includes the subject matter of any of Examples 1-4, and further including a retention plate positioned to fix an orientation of the first connector assembly and the second connector assembly.

Example 6 includes the subject matter of any of Examples 1-5, and wherein the second connector assembly comprises a stem component and a fitting component, wherein the stem component of the second connector assembly is fixed to the base, wherein the stem component of the second connector assembly comprises a tube extending from the base toward the fitting component of the second connector assembly, wherein the stem component of the second connector assembly comprises a flange extending from the tube, wherein the fitting component of the second connector assembly comprises a neck extending into the tube of the stem component of the second connector assembly to fluidly couple to the stem component of the second connector assembly, wherein the fitting component of the second connector assembly comprises a tubing fitting to fluidly couple to tubing, wherein the fitting component of the second connector assembly is able to rotate relative to the stem component of the second connector assembly, further comprising a collar for the of the second connector assembly, the collar for the of the second connector assembly comprising a collar body configured to wrap at least partially around the stem component of the second connector assembly and the fitting component of the second connector assembly; a first flange extending from the collar body to engage with the flange of the stem component of the second connector assembly; and a second flange extending from the collar body to engage with the fitting component of the second connector assembly, the first flange and the second flange to prevent separation of the stem component of the second connector assembly and the fitting component of the second connector assembly.

Example 7 includes the subject matter of any of Examples 1-6, and wherein the first connector assembly is brazed to the base.

Example 8 includes the subject matter of any of Examples 1-7, and wherein the first connector assembly is screwed into the base.

Example 9 includes the subject matter of any of Examples 1-8, and wherein the tubing fitting is a barbed fitting.

Example 10 includes the subject matter of any of Examples 1-9, and wherein the tubing fitting is a press-fit type connector.

Example 11 includes the subject matter of any of Examples 1-10, and further including tubing connected to the tubing fitting, wherein the tubing is flexible polyvinyl chloride.

Example 12 includes the subject matter of any of Examples 1-11, and wherein the first connector assembly has a height less than 15 millimeters from a top surface of the base of the water block.

Example 13 includes the subject matter of any of Examples 1-12, and further including an integrated circuit in thermal contact with the water block.

Example 14 includes an apparatus comprising a water block comprising a base, the water block comprising a first connector assembly and a second connector assembly, wherein the first connector assembly is fluidly coupled to the second connector assembly by an internal channel defined in the water block, wherein the first connector assembly comprises a stem component and a fitting component, wherein the stem component is fixed to the base, wherein the stem component comprises a lower part comprising a tube extending from the base toward the fitting component and an upper part connected to the lower part by one or more pillars, wherein the fitting component comprises a housing surrounding the stem component, wherein the lower part of the stem component partially extends out a lower end of the housing and the upper part of the stem component partially extends out an upper end of the housing, wherein the fitting component comprises a tubing fitting to fluidly couple to tubing, wherein the fitting component is able to rotate relative to the stem component, wherein a fluid is able to pass through the tube of the stem component, around the one or more pillars, and into the tubing fitting of the fitting component.

Example 15 includes the subject matter of Example 14, and wherein a circular slot is defined in an outside surface of the upper part of the stem component that extends around an outer circumference of the upper part, further comprising a C-clip positioned in the circular slot, the C-clip to prevent the fitting component from being removed from the stem component.

Example 16 includes the subject matter of any of Examples 14 and 15, and further including an upper O-ring positioned between the upper part of the stem component and the fitting component and a lower O-ring positioned between the lower part of the stem component and the fitting component, wherein upper O-ring and the lower O-ting create a water-tight seal between the stem component and the fitting component.

Example 17 includes the subject matter of any of Examples 14-16, and wherein the upper part of the stem component comprises a lid that forms a water-tight seal with the upper O-ring to prevent liquid from leaking out a top of the stem component.

Example 18 includes the subject matter of any of Examples 14-17, and wherein the first connector assembly is brazed to the base.

Example 19 includes the subject matter of any of Examples 14-18, and wherein the first connector assembly is screwed into the base.

Example 20 includes the subject matter of any of Examples 14-19, and wherein the tubing fitting is a barbed fitting.

Example 21 includes the subject matter of any of Examples 14-20, and wherein the tubing fitting is a press-fit type connector.

Example 22 includes the subject matter of any of Examples 14-21, and further including tubing connected to the tubing fitting, wherein the tubing is flexible polyvinyl chloride.

Example 23 includes the subject matter of any of Examples 14-22, and wherein the first connector assembly has a height less than 15 millimeters from a top surface of the base of the water block.

Example 24 includes the subject matter of any of Examples 14-23, and further including an integrated circuit in thermal contact with the water block.

Example 25 includes an apparatus comprising a water block comprising a base, the water block comprising a first connector assembly and a second connector assembly, wherein the first connector assembly is fluidly coupled to the second connector assembly by an internal channel defined in the water block, wherein the first connector assembly comprises a stem component and a fitting component, wherein the stem component is fixed to the base, wherein the stem component comprises a tube extending from the base toward the fitting component, wherein a circular slot is defined in an inside surface of the tube that extends around an inner circumference of the tube, wherein the fitting component comprises a tubing fitting to fluidly couple to tubing, wherein the fitting component comprises a neck extending into the tube of the stem component to fluidly couple to the stem component, wherein a circular slot is defined in an outside surface of the neck that extends around an outer circumference of the neck, wherein the fitting component is able to rotate relative to the stem component, further comprising a retainer positioned in the circular slot of the neck of the fitting component, wherein the retainer is also positioned in the circular slot of the tube of the stem component, the retainer to prevent separation of the stem component and the fitting component.

Example 26 includes the subject matter of Example 25, and further including one or more O-rings positioned between the stem component and the fitting component, wherein the one or more O-rings create a water-tight seal between the stem component and the fitting component.

Example 27 includes the subject matter of any of Examples 25 and 26, and wherein the retainer positioned in the circular slot of the neck of the fitting component and in the circular slot of the tube of the stem component is a C-clip.

Example 28 includes the subject matter of any of Examples 25-27, and wherein the first connector assembly is brazed to the base.

Example 29 includes the subject matter of any of Examples 25-28, and wherein the first connector assembly is screwed into the base.

Example 30 includes the subject matter of any of Examples 25-29, and wherein the tubing fitting is a barbed fitting.

Example 31 includes the subject matter of any of Examples 25-30, and wherein the tubing fitting is a press-fit type connector.

Example 32 includes the subject matter of any of Examples 25-31, and further including tubing connected to the tubing fitting, wherein the tubing is flexible polyvinyl chloride.

Example 33 includes the subject matter of any of Examples 25-32, and wherein the first connector assembly has a height less than 15 millimeters from a top surface of the base of the water block.

Example 34 includes the subject matter of any of Examples 25-33, and further including an integrated circuit in thermal contact with the water block.

Example 35 includes an apparatus comprising a water block comprising a base, the water block comprising a first connector assembly and a second connector assembly, wherein the first connector assembly is fluidly coupled to the second connector assembly by an internal channel defined in the water block, wherein the first connector assembly comprises a first tubing fitting and a rotatable connector assembly means to allow the first tubing fitting to rotate relative to the base.

Example 36 includes the subject matter of Example 35, and wherein the rotatable connector assembly means comprises a stem component, a fitting component fluidly coupled to the stem component, and retaining means for retaining the stem component and the fitting component fluidly coupled.

Example 37 includes the subject matter of any of Examples 35 and 36, and further including one or more O-rings positioned between the stem component and the fitting component, wherein the one or more O-rings create a water-tight seal between the stem component and the fitting component.

Example 38 includes the subject matter of any of Examples 35-37, and wherein the first connector assembly is brazed to the base.

Example 39 includes the subject matter of any of Examples 35-38, and wherein the first connector assembly is screwed into the base.

Example 40 includes the subject matter of any of Examples 35-39, and wherein the first tubing fitting is a barbed fitting.

Example 41 includes the subject matter of any of Examples 35-40, and wherein the first tubing fitting is a press-fit type connector.

Example 42 includes the subject matter of any of Examples 35-41, and further including tubing connected to the first tubing fitting, wherein the tubing is flexible polyvinyl chloride.

Example 43 includes the subject matter of any of Examples 35-42, and wherein the first connector assembly has a height less than 15 millimeters from a top surface of the base of the water block.

Example 44 includes the subject matter of any of Examples 35-43, and further including an integrated circuit in thermal contact with the water block.

The invention claimed is:
1. A water block comprising:
a base including an internal channel defined therein; a first connector assembly including:
a fitting component;
a stem component fixed to the base, the stem component including: a tube extending from the base toward the fitting component; and a first flange extending from the tube,
the fitting component including a neck extending into the tube of the stem component to fluidly couple to the stem component, the fitting component including a tubing fitting to fluidly couple to tubing, the fitting component rotatable relative to the stem component;
a collar including:
a collar body to wrap at least partially around the stem component and the fitting component;
a second flange extending from the collar body to engage with the first flange of the stem component; and
a third flange extending from the collar body to engage with the fitting component, the second flange and the third flange to prevent separation of the stem component and the fitting component; and p1 a second connector assembly, the first connector assembly fluidly coupled to the second connector assembly by the internal channel defined in the base.

2. The water block of claim 1, wherein the collar further includes a retainer to hold the collar in place.

3. The water block of claim 2, wherein the retainer is a set screw that is screwed into the third flange and contacts the second flange.

4. The water block of claim 1, further including one or more O-rings positioned between the stem component and the fitting component, wherein the one or more O-rings create a water-tight seal between the stem component and the fitting component.

5. The water block of claim 4, further including a retention plate positioned to fix an orientation of the first connector assembly and the second connector assembly.

6. The water block of claim 1, wherein the stem component is a first stem component, the fitting component is a first fitting component, the tube is a first tube, the neck is a first neck, the tubing fitting is a first tubing fitting, the tubing is first tubing, the collar is a first collar, the collar body is a first collar body, the second connector assembly including: a second fitting component;
a second stem component fixed to the base, the second stem component including: a second tube extending from the base toward the second fitting component; and a fourth flange extending from the second tube,
the second fitting component includes a second neck extending into the second tube of the second stem component to fluidly couple to the second stem component, the second fitting component including a second tubing fitting to fluidly couple to second tubing, the second fitting component rotatable relative to the second stem component; and
a second collar including:
a second collar body to wrap at least partially around the second stem component and the second fitting component;
a fifth flange extending from the second collar body to engage with the fourth flange of the second stem component; and
a sixth flange extending from the second collar body to engage with the second fitting component, the fifth flange and the sixth flange to prevent separation of the second stem component and the second fitting component.

7. The water block of claim 1, wherein the first connector assembly is brazed to the base.

8. The water block of claim 1, wherein the first connector assembly is screwed into the base.

9. The water block of claim 1, wherein the tubing fitting is a barbed fitting.

10. The water block of claim 1, wherein the tubing fitting is a press-fit type connector.

11. The water block of claim 1, further including the tubing connected to the tubing fitting, the tubing including flexible polyvinyl chloride.

12. The water block of claim 1, wherein the first connector assembly has a height less than 15 millimeters from a top surface of the base of the water block.

13. The water block of claim 1, wherein the base is to thermally contact an integrated circuit.

14. A water block comprising:
a base including an internal channel defined therein; a first connector assembly; and a second connector assembly, the first connector assembly fluidly coupled to the second connector assembly by the internal channel defined in the base,
the first connector assembly including: a fitting component;
a stem component fixed to the base, the stem component including: a lower part including a tube extending from the base toward the fitting component; and an upper part connected to the lower part by one or more pillars,
the fitting component including a housing surrounding the stem component, the lower part of the stem component partially extending out of a lower end of the housing and the upper part of the stem component partially extending out of an upper end of the housing, the fitting component including a tubing fitting to fluidly couple to tubing, the fitting component rotatable relative to the stem component,
a fluid to pass through the tube of the stem component, around the one or more pillars, and into the tubing fitting of the fitting component.

15. The water block of claim 14, wherein a circular slot is defined in an outside surface of the upper part of the stem component, the outside surface extending around an outer circumference of the upper part, and further including a C-clip positioned in the circular slot, the C-clip to prevent removal of the fitting component from the stem component.

16. The water block of claim 14, further including: an upper O-ring positioned between the upper part of the stem component and the fitting component; and a lower O-ring positioned between the lower part of the stem component and the fitting component, the upper O-ring and the lower O-ring to create a water-tight seal between the stem component and the fitting component.

17. The water block claim 16, wherein the water-tight seal is a first water-tight seal, the upper part of the stem component including a lid to form a second water-tight seal with the upper O-ring to prevent liquid from leaking out a top of the stem component.

18. The water block of claim 14, wherein the base is to thermally contact an integrated circuit.

19. An apparatus comprising:
a water block including: a base; a first connector assembly; and a second connector assembly, the first connector assembly fluidly coupled to the second connector assembly by an internal channel defined in the water block,
the first connector assembly including: a fitting component;
a stem component fixed to the base, the stem component including a tube extending from the base toward the fitting component, a first circular slot defined in an inside surface of the tube that extends around an inner circumference of the tube,
the fitting component including a tubing fitting to fluidly couple to tubing, the fitting component including a neck extending into the tube of the stem component to fluidly couple to the stem component, a second circular slot defined in an outside surface of the neck that extends around an outer circumference of the neck, the fitting component rotatable relative to the stem component; and
a retainer positioned in the second circular slot of the neck of the fitting component, and positioned in the first circular slot of the tube of the stem component, the retainer to prevent separation of the stem component and the fitting component.

20. The apparatus of claim 19, further including one or more O-rings positioned between the stem component and the fitting component, the one or more O-rings to create a water-tight seal between the stem component and the fitting component.

21. The apparatus of claim 19, wherein the retainer is a C-clip.

22. The apparatus of claim 19, further including an integrated circuit in thermal contact with the water block.

23. An apparatus comprising:
a water block including: a base; a first connector assembly; and a second connector assembly, the first connector assembly fluidly coupled to the second connector assembly by an internal channel defined in the water block,
the first connector assembly including a first tubing fitting and a rotatable connector assembly means to allow the first tubing fitting to rotate relative to the base.

24. The apparatus of claim 23, wherein the rotatable connector assembly means includes: a stem component; a fitting component fluidly coupled to the stem component; and retaining means for retaining the stem component and the fitting component fluidly coupled.

25. The apparatus of claim 24, further including one or more O-rings positioned between the stem component and the fitting component, the one or more O-rings create a water-tight seal between the stem component and the fitting component.

\* \* \* \* \*

UNITED STATES PATENT AND TRADEMARK OFFICE
CERTIFICATE OF CORRECTION

PATENT NO. : 12,248,344 B2  
APPLICATION NO. : 17/214230  
DATED : March 11, 2025  
INVENTOR(S) : Weldon et al.

Page 1 of 1

It is certified that error appears in the above-identified patent and that said Letters Patent is hereby corrected as shown below:

In the Claims

Column 20, Claim 1, Line 66, Delete "p1".

Column 23, Claim 25, Line 24, Delete "O-rings create" and Insert --O-rings to create--.

Signed and Sealed this  
Twenty-ninth Day of July, 2025

Coke Morgan Stewart  
*Acting Director of the United States Patent and Trademark Office*